United States Patent
Choi

(10) Patent No.: US 11,693,564 B2
(45) Date of Patent: Jul. 4, 2023

(54) APPARATUS CONFIGURED TO PERFORM A REPAIR OPERATION

(71) Applicant: SK hynix Inc., Icheon-si (KR)

(72) Inventor: Byeong Chan Choi, Icheon-si (KR)

(73) Assignee: SK hynix Inc., Icheon-si (KR)

(*) Notice: Subject to any disclaimer, the term of this patent is extended or adjusted under 35 U.S.C. 154(b) by 211 days.

(21) Appl. No.: 17/330,038

(22) Filed: May 25, 2021

(65) Prior Publication Data

US 2022/0229563 A1 Jul. 21, 2022

(30) Foreign Application Priority Data

Jan. 15, 2021 (KR) .......................... 10-2021-0006339

(51) Int. Cl.
*G06F 3/06* (2006.01)

(52) U.S. Cl.
CPC .......... *G06F 3/0619* (2013.01); *G06F 3/0647* (2013.01); *G06F 3/0673* (2013.01)

(58) Field of Classification Search
CPC ..... G06F 3/0619; G06F 3/0647; G06F 3/0673
See application file for complete search history.

(56) References Cited

U.S. PATENT DOCUMENTS

| 9,274,715 | B2 | 3/2016 | Chun et al. |
| 9,514,849 | B2 | 12/2016 | You et al. |
| 2016/0300627 | A1* | 10/2016 | You ........................ G11C 29/76 |

FOREIGN PATENT DOCUMENTS

KR 1020160016367 A 2/2016

* cited by examiner

*Primary Examiner* — Jason W Blust
(74) *Attorney, Agent, or Firm* — William Park & Associates Ltd.

(57) ABSTRACT

An apparatus includes a storage area signal generation circuit configured to generate a storage area signal when performing an internal information storage operation and an external information storage operation; and an information storage circuit configured to receive internal failure information, stored in the apparatus, based on the storage area signal and store the received internal failure information as failure information in a set storage capacity, and store external failure information, applied from outside the apparatus, as the failure information in a variable storage capacity.

38 Claims, 18 Drawing Sheets

FIG. 7

| OP11 | | | | | | | |
|---|---|---|---|---|---|---|---|
| FIRST FA STORAGE CIRCUIT | FA_1 | RA1 | SECOND FA STORAGE CIRCUIT | FA_2 | RA2 | THIRD FA STORAGE CIRCUIT | FA_3 | RA0 | FOURTH FA STORAGE CIRCUIT | FA_4 | RA0 |
| SLF_1 | H | SLV_1 | L | SLF_2 | H | SLV_2 | L | SLF_3 | L | SLV_3 | L | SLF_4 | L | SLV_4 | L |

| OP12 | | | | | | | |
|---|---|---|---|---|---|---|---|
| FIRST FA STORAGE CIRCUIT | FA_1 | RA1 | SECOND FA STORAGE CIRCUIT | FA_2 | RA2 | THIRD FA STORAGE CIRCUIT | FA_3 | RA3 | FOURTH FA STORAGE CIRCUIT | FA_4 | RA0 |
| SLF_1 | H | SLV_1 | L | SLF_2 | H | SLV_2 | L | SLF_3 | L | SLV_3 | H | SLF_4 | L | SLV_4 | L |

| First FA Storage Circuit | | Second FA Storage Circuit | | Third FA Storage Circuit | | Fourth FA Storage Circuit | |
|---|---|---|---|---|---|---|---|
| SLF_1 | H | SLF_2 | H | SLF_3 | L | SLF_4 | L |
| SLV_1 | L | SLV_2 | L | SLV_3 | L | SLV_4 | L |
| FA_1 | RA1 | FA_2 | RA2 | FA_3 | RA0 | FA_4 | RA0 |

OP22

| First FA Storage Circuit | | Second FA Storage Circuit | | Third FA Storage Circuit | | Fourth FA Storage Circuit | |
|---|---|---|---|---|---|---|---|
| SLF_1 | H | SLF_2 | H | SLF_3 | L | SLF_4 | L |
| SLV_1 | H | SLV_2 | L | SLV_3 | H | SLV_4 | L |
| FA_1 | RA1 | FA_2 | RA2 | FA_3 | RA1 | FA_4 | RA0 |

OP23

| First FA Storage Circuit | | Second FA Storage Circuit | | Third FA Storage Circuit | | Fourth FA Storage Circuit | |
|---|---|---|---|---|---|---|---|
| SLF_1 | H | SLF_2 | H | SLF_3 | L | SLF_4 | L |
| SLV_1 | H | SLV_2 | L | SLV_3 | L | SLV_4 | H |
| FA_1 | RA1 | FA_2 | RA2 | FA_3 | RA1 | FA_4 | RA1 |

FIG. 9

| OP31 | | | OP32 | | | OP33 | | | OP34 | | |
|---|---|---|---|---|---|---|---|---|---|---|---|
| FIRST FA STORAGE CIRCUIT | FA_1 | RA1 | FIRST FA STORAGE CIRCUIT | FA_1 | RA1 | FIRST FA STORAGE CIRCUIT | FA_1 | RA1 | FIRST FA STORAGE CIRCUIT | FA_1 | RA1 |
| SLF_1 | H | | SLF_1 | H | | SLF_1 | H | | SLF_1 | H | |
| SLV_1 | L | | SLV_1 | H | | SLV_1 | H | | SLV_1 | L | |
| SECOND FA STORAGE CIRCUIT | FA_2 | RA2 | SECOND FA STORAGE CIRCUIT | FA_2 | RA2 | SECOND FA STORAGE CIRCUIT | FA_2 | RA2 | SECOND FA STORAGE CIRCUIT | FA_2 | RA2 |
| SLF_2 | H | | SLF_2 | H | | SLF_2 | H | | SLF_2 | H | |
| SLV_2 | L | | SLV_2 | L | | SLV_2 | L | | SLV_2 | L | |
| THIRD FA STORAGE CIRCUIT | FA_3 | RA0 | THIRD FA STORAGE CIRCUIT | FA_3 | RA1 | THIRD FA STORAGE CIRCUIT | FA_3 | RA1 | THIRD FA STORAGE CIRCUIT | FA_3 | RA1 |
| SLF_3 | L | | SLF_3 | L | | SLF_3 | L | | SLF_3 | L | |
| SLV_3 | L | | SLV_3 | H | | SLV_3 | H | | SLV_3 | L | |
| FOURTH FA STORAGE CIRCUIT | FA_4 | RA0 | FOURTH FA STORAGE CIRCUIT | FA_4 | RA0 | FOURTH FA STORAGE CIRCUIT | FA_4 | RA3 | FOURTH FA STORAGE CIRCUIT | FA_4 | RA3 |
| SLF_4 | L | | SLF_4 | L | | SLF_4 | L | | SLF_4 | L | |
| SLV_4 | L | | SLV_4 | L | | SLV_4 | H | | SLV_4 | L | |

FIG. 18

| | | OP42 | | | | | | | |
|---|---|---|---|---|---|---|---|---|---|
| | | FIRST FA STORAGE CIRCUIT | | | SECOND FA STORAGE CIRCUIT | | | THIRD FA STORAGE CIRCUIT | | FOURTH FA STORAGE CIRCUIT | |
| SLF_1 | H | FA_1 | RA1/RA2 | SLF_2 | H | FA_2 | RA3/RA4 | SLF_3 | L | FA_3 | RA1 | SLF_4 | L | FA_4 | RA0 |
| SLV_1 | L | | | SLV_2 | L | | | SLV_3 | H | | | SLV_4 | L | | |

| | | OP41 | | | | | | | |
|---|---|---|---|---|---|---|---|---|---|
| | | FIRST FA STORAGE CIRCUIT | | | SECOND FA STORAGE CIRCUIT | | | THIRD FA STORAGE CIRCUIT | | FOURTH FA STORAGE CIRCUIT | |
| SLF_1 | H | FA_1 | RA1/RA2 | SLF_2 | H | FA_2 | RA3/RA4 | SLF_3 | L | FA_3 | RA0 | SLF_4 | L | FA_4 | RA0 |
| SLV_1 | L | | | SLV_2 | L | | | SLV_3 | L | | | SLV_4 | L | | |

APPARATUS CONFIGURED TO PERFORM A REPAIR OPERATION

CROSS-REFERENCE TO RELATED APPLICATION

The present application claims priority under 35 U.S.C. § 119(a) to Korean Patent Application No. 10-2021-0006339 filed on Jan. 15, 2021 in the Korean Intellectual Property Office, which is incorporated herein by reference in its entirety.

BACKGROUND

1. Technical Field

Embodiments of the disclosure may generally relate to an apparatus configured to perform a repair operation.

2. Related Art

Among electronic apparatuses, a semiconductor apparatus may perform a repair operation of replacing a failed memory cell with a separate redundancy memory cell. To this end, the semiconductor apparatus may store therein in advance information on the failed memory cell, and may perform the repair operation using the information stored therein when accessing the failed memory cell. Also, the semiconductor apparatus may receive information on the failed memory cell from the outside and store the received information therein, and may perform the repair operation using the information applied from the outside when accessing the failed memory cell.

The semiconductor apparatus may use a soft post package repair mode to perform a repair operation. The soft post package repair mode refers to a mode in which the semiconductor apparatus receives information on a failed memory cell from a controller and stores the received information therein when the semiconductor apparatus is in a package state.

SUMMARY

In an embodiment, an apparatus may include: a storage area signal generation circuit configured to generate a storage area signal when performing an internal information storage operation and an external information storage operation; and an information storage circuit configured to receive internal failure information, stored in the apparatus, based on the storage area signal and store the received internal failure information as failure information in a set storage capacity, and store external failure information, applied from outside the apparatus, as the failure information in a variable storage capacity, the variable storage capacity being adjusted depending on the set storage capacity.

In an embodiment, an apparatus may include: a first failure information storage circuit configured to receive first internal failure information stored in the apparatus and store the received first internal failure information as first failure information, when performing an internal information storage operation, and activate a first comparison control signal; and a first failure information comparison circuit configured to generate a first match signal by comparing external failure information, applied from outside the apparatus, with the first failure information based on the first comparison control signal in an external information reception mode, the first match signal being activated to control whether to activate the first comparison control signal.

In an embodiment, an apparatus may include: a first failure information storage circuit configured to receive external failure information applied from outside the apparatus and store the received external failure information as first failure information, in a first external information reception mode, and activate a first comparison control signal; and a first failure information comparison circuit configured to generate a first match signal by comparing the external failure information, applied in a second external information reception mode, with the first failure information based on the first comparison control signal, the first match signal being activated to control whether to activate the first comparison control signal.

In an embodiment, an apparatus may include: a failure information storage circuit configured to receive one of internal failure information stored in the apparatus and external failure information applied from outside the apparatus and store the received Information as failure information, and generate a comparison control signal by receiving an internal information storage flag and an external information storage flag; and a failure information comparison circuit configured to generate a match signal for a repair operation, by comparing a combination of a row address with the failure information based on the comparison control signal when performing an active operation.

In an embodiment, an apparatus may include: an information storage circuit configured to receive internal failure information stored in the apparatus and store the received internal failure information as first failure information, and receive external failure information applied from outside the apparatus and store the received external failure information as second failure information; an information comparison circuit configured to, when performing an active operation, generate an internal match signal by comparing a combination of a row address with the first failure information, and generate an external match signal by comparing a combination of the row address with the second failure information; and a repair control circuit configured to generate a first match signal for a repair operation, based on the internal match signal, and generate a second match signal for the repair operation, based on the external match signal, the external match signal being activated to control whether to activate the first match signal.

BRIEF DESCRIPTION OF THE DRAWINGS

FIGS. 7, 8, and 9 are diagrams to assist in the explanation of operations in which failure information, a setting information signal and a variable information signal are stored in an information storage circuit illustrated in FIG. 2.

FIG. 18 is a diagram to assist in the explanation of an operation in which failure information, a setting information signal and a variable information signal are stored in an information storage circuit illustrated in FIG. 14.

DETAILED DESCRIPTION

Figure 1:
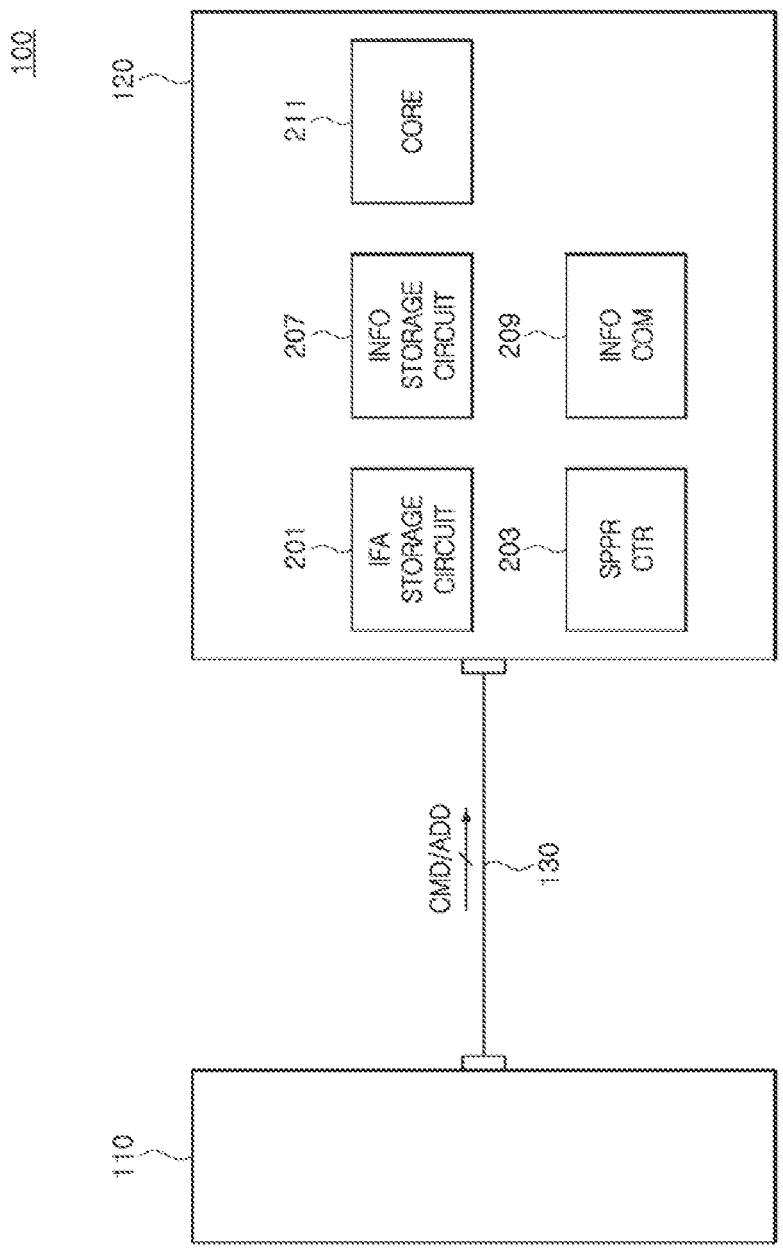
FIG. 1 is a block diagram illustrating the configuration of a system in accordance with an embodiment of the present disclosure.

In the description of the following embodiments, the term "preset" means that the numerical value of a parameter is determined in advance when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the one component may be coupled or connected to the another component directly or by the medium of still another component. On the other hand, the descriptions of "directly coupled" or "directly connected" should be understood to mean that one component is coupled or connected to another component directly without intervention of a still another component.

"Logic high level" and "logic low level" are used to describe logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, various examples of embodiments of the disclosure will be described in detail with reference to the accompanying drawings. These embodiments are only for illustrating the disclosure, and the scope of protection of the disclosure is not limited by these embodiments.

Various embodiments are directed to an apparatus performing a repair operation.

According to the present disclosure, when storing, for a repair operation, internal failure information and external failure information in a storage space, by adjusting a storage capacity for storing the external failure information, depending on a set storage capacity in which the internal failure information is stored, it may be possible to use a storage space, in which the internal failure information is not stored, as a storage space for storing the external failure information.

Also, according to the present disclosure, by comparing external failure information, applied from the outside, with previously stored internal failure information and accordingly controlling, in advance, a repair operation so that the repair operation is not performed on the internal failure information the same as the external failure information, it may be possible to prevent an abnormal operation that occurs when the external failure information and the internal failure information are the same in a repair operation.

Further, according to the present disclosure, by comparing external failure information, applied from the outside, with previously stored external failure information and accordingly controlling, in advance, a repair operation so that the repair operation is not performed on the external failure information the same as the external failure information applied from the outside, it may be possible to prevent an abnormal operation that occurs when the external failure information are the same in a repair operation.

In addition, according to the present disclosure, by comparing a combination of a row address with previously stored internal failure information and external failure information in an active operation and accordingly controlling a repair operation so that the repair operation is not performed on the internal failure information including information set in the external failure information, it may be possible to prevent an abnormal operation that occurs when the internal failure information includes the information set in the external failure information in a repair operation.

FIG. 1 is a block diagram illustrating the configuration of a system 100 in accordance with an embodiment of the present disclosure. As illustrated in FIG. 1, the system 100 may include a first apparatus 110 and a second apparatus 120.

The first apparatus 110 may transmit an external command CMD to the second apparatus 120 through a command/address transmission line 130. The first apparatus 110 may transmit an external address ADD to the second apparatus 120 through the command/address transmission line 130. The first apparatus 110 may be implemented by a controller. The number of bits of the external command CMD may be variously set depending on an embodiment. The number of bits of the external address ADD may be variously set depending on an embodiment. According to an embodiment, the first apparatus 110 may transmit the external command CMD and the external address ADD to the second apparatus 120 through different transmission lines, respectively.

The second apparatus 120 may include an internal failure information storage circuit (IFA STORAGE CIRCUIT) 201, an operation control circuit (SPPR CTR) 203, an information storage circuit (INFO STORAGE CIRCUIT) 207, an information comparison circuit (INFO COM) 209 and a core circuit (CORE) 211. The second apparatus 120 may be implemented by a semiconductor apparatus. The second apparatus 120 may perform various internal operations including an internal information storage operation, an external information reception mode and an active operation, by receiving the external command CMD and the external address ADD from the first apparatus 110.

The second apparatus 120 may generate a first internal command BOOT_UP (see FIG. 2), a second internal command SPPR (see FIG. 2) and a third internal command ACT (see FIG. 2), based on the external command CMD. The second apparatus 120 may generate the first internal command BOOT_UP (see FIG. 2) based on the external command CMD having a logic level combination for performing the internal information storage operation. The second apparatus 120 may generate the second internal command SPPR (see FIG. 2) based on the external command CMD having a logic level combination for performing the external information reception mode. The external information reception mode may involve an external information storage operation and a comparison control operation. The external information reception mode may be performed after the internal information storage operation is completed. The external information reception mode may include a first external information reception mode and a second external information reception mode. The second external information reception mode may be performed after the first external information reception mode is ended. The external information reception mode may be set as a soft post package repair mode in which, when the second apparatus 120 is in a package state, the second apparatus 120 receives, from the first apparatus 110, the external address ADD having information set in external failure information EFA (see FIG. 2). The second apparatus 120 may generate the third internal command ACT (see FIG. 2) based on the external command CMD having a logic level combination for performing the active operation. The active operation may involve a repair operation.

When performing the internal information storage operation, the internal failure information storage circuit 201 may output first to M^th internal failure information IFA_1 to IFA_M (see FIG. 2) stored therein (M may be set as a natural number), When performing the external information reception mode, the operation control circuit 203 may generate the external failure information EFA (see FIG. 2) from the external address ADD applied from the first apparatus 110.

Figure 2:
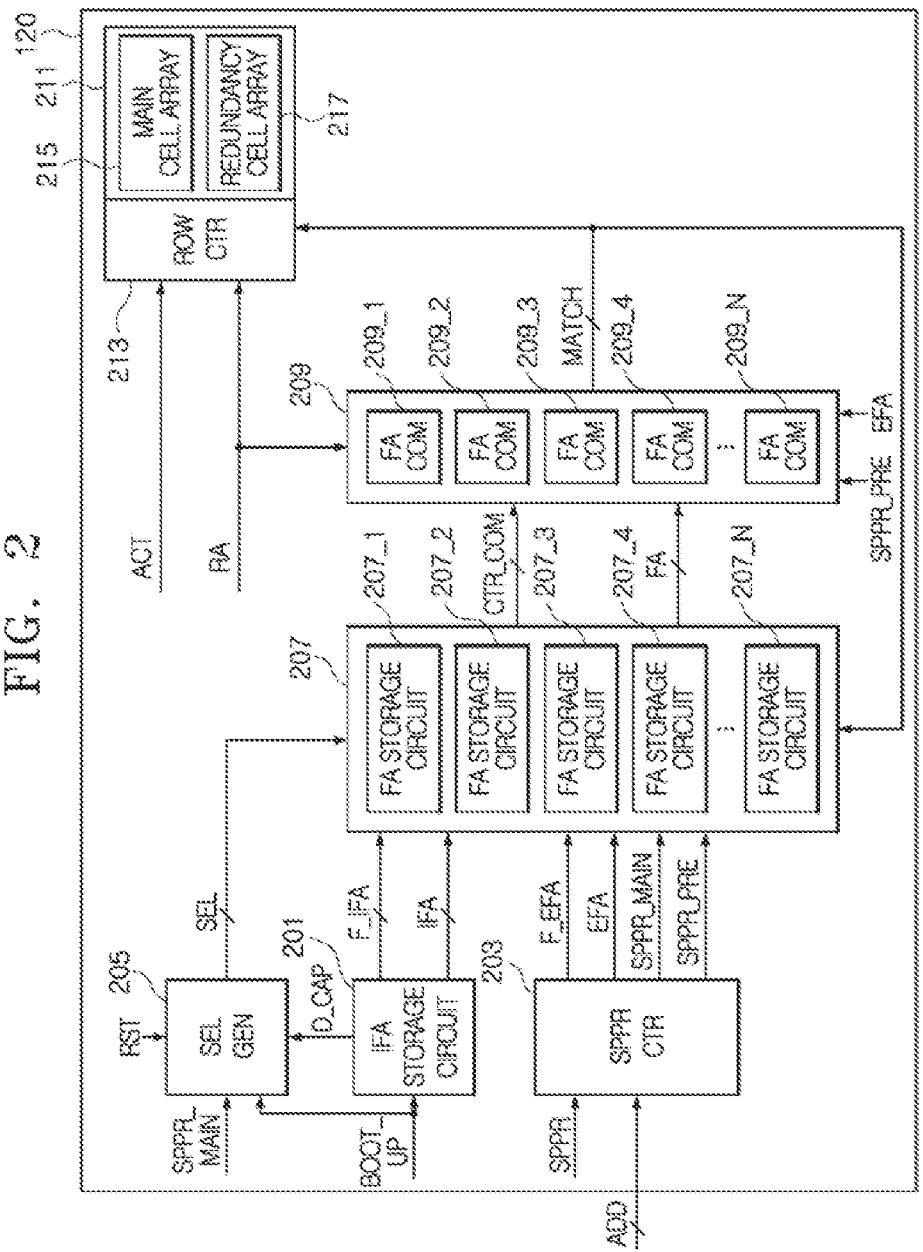
FIG. 2 is a block diagram illustrating the configuration of an embodiment of a second apparatus included in the system illustrated in FIG. 1.

The information storage circuit 207 may include a plurality of failure information storage circuits 207_1 to 207_N (see FIG. 2). The plurality of failure information storage circuits 207_1 to 207_N (see FIG. 2) may each receive one of first to N^th internal failure information IFA_1 to IFA_N (see FIG. 2 where, in an embodiment, IFA may represent IFA_1 to IFA_N) and the external failure information EFA (see FIG. 2) (N may be set as a natural number equal to or greater than M), and may store received information as first to N^th failure information FA_1 to FA_N, respectively (see FIG. 2 where, in an embodiment, FA may represent FA_1 to FA_N). Each of the plurality of failure information storage circuits 207_1 to 207_N (see FIG. 2) may have a unit storage capacity for storing corresponding failure information of the first to N^th failure information FA_1 to FA_N (see FIG. 2). A storage capacity of the plurality of failure information storage circuits 207_1 to 207_N (see FIG. 2) may be set as an N multiple of the unit storage capacity.

When performing the internal information storage operation, the information storage circuit 207 may store the first to M^th internal failure information IFA_1 to IFA_M (see FIG. 2) in a predetermined set storage capacity. Each time the information storage circuit 207 performs the external information storage operation, the information storage circuit 207 may store the external failure information EFA (see FIG. 2) in a variable storage capacity, The sum of the set storage capacity and the variable storage capacity may be set as the storage capacity of the plurality of failure information storage circuits 207_1 to 207_N (see FIG. 2). Accordingly, when storing, for the repair operation, internal failure information IFA (see FIG. 2) and the external failure information EFA (see FIG. 2) in a storage space, the second apparatus 120 may adjust a storage capacity for storing the external failure information EFA (see FIG. 2) depending on the set storage capacity in which the internal failure information IFA (see FIG. 2) is stored, thereby using a storage space, in which the internal failure information IFA (see FIG. 2) is not stored, as a storage space for storing the external failure information EFA (see FIG. 2).

When performing the internal information storage operation, the N^th failure information storage circuit 207_N (see FIG. 2) may store the N^th internal failure information IFA_N (see FIG. 2) as the N^th failure information FA_N (see FIG. 2), and may activate an N^th comparison control signal CTR_COM_N (see FIG. 2 where, in an embodiment, CTR_COM may represent CTR_COM_N). When performing the external information storage operation, the N^th failure information storage circuit 207_N (see FIG. 2) may store the external failure information EFA (see FIG. 2) as the N^th failure information FA_N (see FIG. 2), and may activate the N^th comparison control signal CTR_COM_N (see FIG. 2).

The information comparison circuit 209 may include a plurality of failure information comparison circuits 209_1 to 209_N (see FIG. 2). When performing the active operation, the N^th failure information comparison circuit 209_N (see FIG. 2) may generate an N^th match signal MATCH_N (see FIG. 2 where, in an embodiment, MATCH may represent MATCH_1 to MATCH_N) by comparing a combination of a row address RA (see FIG. 2) with the N^th failure information FA_N (see FIG. 2) based on the N^th comparison control signal CTR_COM_N. When performing the external information reception mode, the N^th failure information comparison circuit 209_N (see FIG. 2) may generate the N^th match signal MATCH_N (see FIG. 2) by comparing the external failure information EFA (see FIG. 2) with the N^th failure information FA_N (see FIG. 2) based on the N^th comparison control signal CTR_COM_N.

When a match signal MATCH (see FIG. 2) is inactivated in the active operation, the core circuit 211 may activate a word line of a main cell array 215 (see FIG. 2) according to a combination of the row address RA (see FIG. 2). When the match signal MATCH (see FIG. 2) is activated in the active operation, the core circuit 211 may perform the repair operation by activating a word line of a redundancy cell array 217 (see FIG. 2) corresponding to the match signal MATCH (see FIG. 2).

When performing the internal information storage operation, the first failure information storage circuit 207_1 (see FIG. 2) may store the first internal failure information IFA_1 (see FIG. 2) as the first failure information FA_1 (see FIG. 2), and may activate a first comparison control signal CTR_COM_1 (see FIG. 2). When the first comparison control signal CTR_COM_1 (see FIG. 2) is activated in the external information reception mode, the first failure information comparison circuit 209_1 (see FIG. 2) may compare the external failure information EFA (see FIG. 2) with the first failure information FA_1 (see FIG. 2). When the first comparison control signal CTR_COM_1 (see FIG. 2) is activated in the external information reception mode and the external failure information EFA (see FIG. 2) and the first failure information FA_1 (see FIG. 2) are the same, the first failure information comparison circuit 209_1 (see FIG. 2) may activate a first match signal MATCH_1 (see FIG. 2). When the first match signal MATCH_1 (see FIG. 2) is activated in the external information reception mode, the first failure information storage circuit 207_1 (see FIG. 2) may inactivate the first comparison control signal CTR_COM_1 (see FIG. 2). The second failure information storage circuit 207_2 (see FIG. 2) may store the external failure information EFA (see FIG. 2), applied in the external information reception mode, as the second failure information FA_2 (see FIG. 2), and may activate a second comparison control signal CTR_COM_2 (see FIG. 2). When the first comparison control signal CTR_COM_1 (see FIG. 2) is inactivated in the active operation, the first failure information comparison circuit 209_1 (see FIG. 2) may inactivate the first match signal MATCH_1. When the second comparison control signal CTR_COM_2 (see FIG. 2) is activated in the active operation and a combination of the row address RA (see FIG. 2) and the second failure information FA_2 (see FIG. 2) are the same, the second failure information comparison circuit 209_2 (see FIG. 2) may activate a second match signal MATCH_2 (see FIG. 2). Accordingly, the second apparatus 120 may compare the external failure information EFA (see FIG. 2), applied from the outside, with the previously stored internal failure information IFA (see FIG. 2), and accordingly, may control, in advance, the repair operation so that the repair operation is not performed on the internal failure information IFA (see FIG. 2) the same as the external failure information EFA (see FIG. 2), thereby preventing an abnormal operation that occurs when the external failure information EFA (see FIG. 2) and the internal failure information IFA (see FIG. 2) are the same in the repair operation.

The first failure information storage circuit 207_1 (see FIG. 2) may store the external failure information EFA (see FIG. 2), applied in the first external information reception mode, as the first failure information FA_1 (see FIG. 2), and may activate the first comparison control signal CTR_COM_1 (see FIG. 2). When the first comparison control signal CTR_COM_1 (see FIG. 2) is activated in the second external information reception mode, the first failure information comparison circuit 209_1 (see FIG. 2) may compare the external failure information EFA (see FIG. 2), applied in the second external information reception mode, with the first failure information FA_1 (see FIG. 2). When the first comparison control signal CTR_COM_1 (see FIG. 2) is activated in the second external information reception mode and the external failure information EFA (see FIG. 2), applied in the second external information reception mode, and the first failure information FA_1 (see FIG. 2) are the same, the first failure information comparison circuit 209_1 (see FIG. 2) may activate the first match signal MATCH_1 (see FIG. 2). When the first match signal MATCH_1 (see FIG. 2) is activated in the second external information reception mode, the first failure information storage circuit 207_1 (see FIG. 2) may inactivate the first comparison control signal CTR_COM_1 (see FIG. 2). The second failure information storage circuit 207_2 (see FIG. 2) may store the external failure information EFA (see FIG. 2), applied in the second external information reception mode, as the second failure information FA_2 (see FIG. 2), and may activate the second comparison control signal CTR_COM_2 (see FIG. 2), Accordingly, the second apparatus 120 may compare the external failure information EFA (see FIG. 2), applied from the outside, with the previously stored external failure information EFA (see FIG. 2), and accordingly, may control, in advance, the repair operation so that the repair operation is not performed on the external failure information EFA (see FIG. 2) the same as the external failure information EFA (see FIG. 2) applied from the outside, thereby preventing an abnormal operation that occurs when the external failure information EFA (see FIG. 2) are the same in the repair operation.

FIG. 2 is a block diagram illustrating the configuration of an embodiment of the second apparatus 120 illustrated in FIG. 1. As illustrated in FIG. 2, the second apparatus 120 may include the internal failure information storage circuit (IFA STORAGE CIRCUIT) 201, the operation control circuit (SPPR CTR) 203, a storage area signal generation circuit (SEL GEN) 205, the information storage circuit 207, the information comparison circuit 209 and the core circuit 211.

When performing the internal information storage operation based on the first internal command BOOT_UP, the internal failure information storage circuit 201 may output the internal failure information IFA, an internal information storage flag F_IFA and capacity information D_CAP stored therein. The first internal command BOOT_UP may be activated to perform the internal information storage operation. The internal failure information storage circuit 201 may be implemented by an array rupture e-fuse (ARE) in which a plurality of e-fuses are arranged in an array format. The internal failure information storage circuit 201 may store therein the internal failure information IFA, the internal information storage flag F_IFA and the capacity information D_CAP by programming the internal failure information IFA, the internal information storage flag F_IFA and the capacity information D_CAP in e-fuses. The internal failure information IFA may be set as information corresponding to a failed memory cell. The internal failure information IFA may be set as a combination of the row address RA corresponding to a faded memory cell. The intern& failure information IFA may include the plurality of internal failure information to The plurality of internal failure information IFA_1 to IFA_N may be set as information corresponding to different memory cells, respectively, For example, the first internal failure information IFA_1 may be set as a first combination of the row address RA corresponding to a first failed memory cell. The second internal failure information IFA_2 may be set as a second combination of the row address RA corresponding to a second failed memory cell, The internal failure information storage circuit 201 may program the internal information storage flag F_IFA depending on a programming state of the internal failure information IFA, and may store the programmed internal information storage flag F_IFA therein. The internal failure information storage circuit 201 may store therein the activated internal information storage flag F_IFA when the internal failure information IFA is programmed therein. The internal failure information storage circuit 201 may store therein the inactivated internal information storage flag F_IFA when the internal failure information IFA is not programmed therein. That is to say, when the internal failure information IFA is programmed therein, the internal failure information storage circuit 201 may activate the internal information storage flag F_IFA in the internal information storage operation. When the internal failure information IFA is not programmed therein, the internal failure information storage circuit 201 may inactivate the internal information storage flag F_IFA in the internal information storage operation. The internal information storage flag F_IFA may include a plurality of internal information storage flags F_IFA_1 to F_IFA_N. For example, when the first internal failure information IFA_1 is programmed therein in the internal information storage operation, the internal failure information storage circuit 201 may activate the first internal information storage flag F_IFA_1. When the second internal failure information IFA_2 is in a programmed state in the internal information storage operation, the internal failure information storage circuit 201 may activate the second internal information storage flag F_IFA_2.

The internal failure information storage circuit 201 may program the capacity information D_CAP according to the number of the programmed internal failure information IFA, and may store the programmed capacity information D_CAP therein. When the first to M^th internal failure information to of the plurality of internal failure information IFA_1 to IFA_N are programmed therein, the internal failure information storage circuit 201 may program the capacity information D_CAP as information corresponding to M (M may be set as the number of the internal failure information IFA programmed in the internal failure information storage circuit 201), For example, when the first internal failure information IFA_1 among the first to fourth internal failure information IFA_1 to IFA_4 is programmed therein, the internal failure information storage circuit 201 may program the capacity information D_CAP as information corresponding to 1. When the first and second internal failure information IFA_1 and IFA_2 among the first to fourth internal failure information IFA_1 to IFA_4 are programmed therein, the internal failure information storage circuit 201 may program the capacity information D_CAP as information corresponding to 2. When performing the internal information storage operation, the internal failure information storage circuit 201 may output the capacity information D_CAP set as information corresponding to M.

The operation control circuit 203 may generate the external failure information EFA, an external information storage flag F_EFA, a comparison control mode signal SPPR_PRE and an information storage mode signal SPPR_MAIN, based on the second internal command SPPR and the external address ADD.

When performing the external information reception mode based on the second internal command SPPR, the operation control circuit 203 may generate the external failure information EFA and the external information storage flag F_EFA from the external address ADD applied from the outside. The second internal command SPPR may be activated to perform the external information reception mode. When performing the external information reception mode, the operation control circuit 203 may output the external address ADD as the external failure information EFA. When the external information reception mode is performed, the external address ADD may be set as a combination of the row address RA corresponding to a faded memory cell. In other words, the external failure information EFA may be set as a combination of the row address RA corresponding to a failed memory cell. The operation control circuit 203 may activate the external information storage flag F_EFA when receiving the external address ADD in the external information reception mode.

When performing the external information reception mode based on the second internal command SPPR, the operation control circuit 203 may generate the comparison control mode signal SPPR_PRE for the comparison control operation and the information storage mode signal SPPR_MAIN for the external information storage operation. When performing the external information reception mode, the operation control circuit 203 may sequentially generate the comparison control mode signal SPPR_PRE and the information storage mode signal SPPR_MAIN. The comparison control mode signal SPPR_PRE may be activated to perform the comparison control operation in the external information reception mode. The information storage mode signal SPPR_MAIN may be activated to perform the external information storage operation in the external information reception mode. Namely, the external information storage operation may be performed after the comparison control operation is performed. A detailed description of an operation in which the operation control circuit 203 generates the comparison control mode signal SPPR_PRE and the information storage mode signal SPPR_MAIN will be described later with reference to FIG. 3.

The storage area signal generation circuit 205 may generate a storage area signal SEL from the capacity information D_CAP based on the first internal command BOOT_UP, the information storage mode signal SPPR_MAIN and a reset signal RST. The storage area signal SEL may include a plurality of storage area signals SEL_1 to SEL_N. The plurality of storage area signals SEL_1 to SEL_N may be generated to store the first to N^th internal failure information IFA_1 to IFA_N or the external failure information EFA as the first to N^th failure information FA_1 to FA_N in correspondence to the plurality of different failure information storage circuits 207_1 to 207_N, respectively. For example, the first storage area signal SEL_1 may be activated to store the first internal failure information IFA_1 or the external failure information EFA as the first failure information FA_1 in correspondence to the first failure information storage circuit 207_1. The first storage area signal SEL_1 may be activated to store the first internal failure information IFA _1 as the first failure information FA_1 in correspondence to the first failure information storage circuit 207_1 when the internal information storage operation is performed. The first storage area signal SEL_1 may be activated to store the external failure information EFA as the first failure information FA_1 in correspondence to the first failure information storage circuit 207_1 when the external information storage operation is performed. The second storage area signal SEL_2 may be activated to store the second internal failure information IFA_2 or the external failure information EFA as the second failure information FA_2 in correspondence to the second failure information storage circuit 207_2. The second storage area signal SEL_2 may be activated to store the second internal failure information IFA_2 as the second failure information FA_2 in correspondence to the second failure information storage circuit 207_2 when the internal information storage operation is performed. The second storage area signal SEL_2 may be activated to store the external failure information EFA as the second failure information FA_2 in correspondence to the second failure information storage circuit 207_2 when the external information storage operation is performed.

When performing the internal information storage operation, the storage area signal generation circuit 205 may activate the storage area signal SEL corresponding to the set storage capacity, based on the capacity information D_CAP. The set storage capacity may be set as a capacity corresponding to the number of the internal failure information IFA programmed in the internal failure information storage circuit 201. For example, the set storage capacity may be set as an M multiple of the unit storage capacity. The storage area signal generation circuit 205 may activate the first to M^th storage area signals SEL_1 to SEL_M when the set storage capacity is an M multiple of the unit storage capacity in the internal information storage operation. For example, the storage area signal generation circuit 205 may activate the first storage area signal SEL_1 when the set storage capacity is 1 multiple of the unit storage capacity in the internal information storage operation. The storage area signal generation circuit 205 may activate the first and second storage area signals SE1_1 and SEL_2 when the set storage capacity is a 2 multiple of the unit storage capacity in the internal information storage operation.

Each time the storage area signal generation circuit 205 performs the external information storage operation, the storage area signal generation circuit 205 may activate one of the storage area signals SEL corresponding to a remaining storage capacity, based on the capacity information D_CAP. The remaining storage capacity may be set as a difference between the storage capacity of the plurality of failure information storage circuits 207_1 to 207_N and a capacity in which the failure information FA is stored in the plurality of failure information storage circuits 207_1 to 207_N. Each time the storage area signal generation circuit 205 performs the external information storage operation, the storage area signal generation circuit 205 may update information set in the capacity information D_CAP. For example, each time the external information storage operation is performed, the capacity information D_CAP may be updated as information corresponding to M+I (I may be set as the number of times the external information storage operation is performed). Each time the storage area signal generation circuit 205 performs the external information storage operation in the external information reception mode, the storage area signal generation circuit 205 may activate an (M+I)^th storage area signal SEL_M+I among the (M+I)^th to N^th storage area signals SEL_M+I to SEL_N each corresponding to the remaining storage capacity. For example, when performing the external information storage operation in the first external information reception mode, the storage area signal generation circuit 205 may activate an (M+1)^th storage area signal SEL_M+1 among the (M+1)^th to N^th storage area signals SEL_M+1 to SEL_N each corresponding to the remaining storage capacity. When performing the external information storage operation in the second external information reception mode, the storage area signal generation circuit 205 may activate an (M+2)^th storage area signal SEL_M+2 among the (M+2)^th to N^th storage area signals SEL_M+2 to SEL_N each corresponding to the remaining storage capacity.

The storage area signal generation circuit 205 may initialize information set in the capacity information D_CAP, based on the reset signal RST, when performing an initialization operation. The reset signal RST may be activated to perform an initialization operation for the external information reception mode. When performing the initialization operation, the storage area signal generation circuit 205 may initialize information set in the capacity information D_CAP. For example, when the initialization operation is performed, the capacity information D_CAP may be initialized to information corresponding to M. That is to say, when performing the initialization operation, the storage area signal generation circuit 205 may initialize the number I of times the external information storage operation is performed.

The information storage circuit 207 may include the plurality of failure information storage circuits (FA STORAGE CIRCUIT) 207_1 to 207_N. The information storage circuit 207 may generate the failure information FA and the comparison control signal CTR_COM from the internal failure information IFA, the internal information storage flag F_IFA, the external failure information EFA and the external information storage flag F_EFA based on the storage area signal SEL, the comparison control mode signal SPPR_PRE, the information storage mode signal SPPR_MAIN and the match signal MATCH.

The information storage circuit 207 may receive the internal failure information IFA and the external failure information EFA based on the storage area signal SEL, and may store the received internal failure information IFA and external failure information EFA as the failure information FA in the plurality of failure information storage circuits 207_1 to 207_N. Each of the plurality of failure information storage circuits 207_1 to 207_N may receive one of the internal failure information IFA and the external failure information EFA, and may store the received information as the failure information FA. The failure information FA may include the plurality of failure information FA_1 to FA_N. Each of the plurality of failure information storage circuits 207_1 to 207_N may have the unit storage capacity for storing corresponding failure information of the plurality of failure information FA_1 to FA_N. The storage capacity of the plurality of failure information storage circuits 207_1 to 207_N may be set as an N multiple of the unit storage capacity.

When performing the internal information storage operation, the information storage circuit 207 may store the internal failure information IFA as the failure information FA in the set storage capacity based on the storage area signal SEL. The information storage circuit 207 may store the first to M^th internal failure information IFA_1 to IFA_M as the first to M^th failure information FA_1 to FA_M, respectively, in the first to M^th failure information storage circuits 207_1 to 207_M corresponding to the first to M^th storage area signals SEL_1 to SEL_M which are activated when performing the internal information storage operation. For example, when the first storage area signal SEL_1 is activated in the internal information storage operation, the information storage circuit 207 may store the first internal failure information IFA_1 as the first failure information FA_1 in the first failure information storage circuit 207_1. When the first and second storage area signals SEL_1 and SEL_2 are activated in the internal information storage operation, the information storage circuit 207 may store the first and second internal failure information IFA_1 and IFA_2 as the first and second failure information FA_1 and FA_2 in the first and second failure information storage circuits 207_1 and 207_2, respectively.

When performing the external information storage operation, the information storage circuit 207 may store the external failure information EFA as the failure information FA in the variable storage capacity based on the storage area signal SEL. The variable storage capacity may be set as a difference between the storage capacity of the plurality of failure information storage circuits 207_1 to 207_N and the set storage capacity. In other words, the sum of the set storage capacity and the variable storage capacity may be set as the storage capacity of the plurality of failure information storage circuits 207_1 to 207_N. Accordingly, the variable storage capacity may be adjusted depending on the set storage capacity. The information storage circuit 207 may store the external failure information EFA as (M+I)^th failure information FA_M+I in an (M+I)^th failure information storage circuit 207_M+I corresponding to the (M+I)^th storage area signal SEL_M+I which is activated each time the information storage circuit 207 performs the external information storage operation. Accordingly, when storing, for the repair operation, the internal failure information IFA and the external failure information EFA in a storage space, the information storage circuit 207 may adjust a storage capacity in which the external failure information EFA is stored, depending on the set storage capacity in which the internal failure information IFA is stored, thereby using a storage space, in which the internal failure information IFA is not stored, as a storage space for storing the external failure information EFA.

The information storage circuit 207 may receive and store the internal information storage flag F_IFA and the external information storage flag F_EFA in the plurality of failure information storage circuits 207_1 to 207_N based on the storage area signal SEL and the information storage mode signal SPPR_MAIN. Each of the plurality of failure information storage circuits 207_1 to 207_N may store the internal information storage flag F_IFA when performing the internal information storage operation. Each of the plurality of failure information storage circuits 207_1 to 207_N may store the external information storage flag F_EFA when performing the external information storage operation. The information storage circuit 207 may store the activated first to M^th internal information storage flags F_IFA_1 to F_IFA_M in the first to M^th failure information storage circuits 207_1 to 207_M, respectively, corresponding to the first to M^th storage area signals SEL_1 to SEL_M which are activated when performing the internal information storage operation. The information storage circuit 207 may store the activated external information storage flag F_EFA in the (M+I)^th failure information storage circuit 207 corresponding to the (M+I)^th storage area signal SEL_M+I which is activated each time the information storage circuit 207 performs the external information storage operation.

The information storage circuit 207 may generate the comparison control signal CTR_COM from the stored internal information storage flag F_IFA and the stored external information storage flag F_EFA. The comparison control signal CTR_COM may include a plurality of comparison control signals CTR_COM_1 to CTR_COM_N. The comparison control signal CTR_COM may be activated to enable the information comparison circuit 209. The first to N^th comparison control signals CTR_COM_1 to CTR_COM_N may be activated to enable the failure information comparison circuits 209_1 to 209_N, respectively. For example, the first comparison control signal CTR_COM_1 may be activated to enable the first failure information comparison circuit 209_1. The second comparison control signal CTR_COM_2 may be activated to enable the second failure information comparison circuit 209_2. The information storage circuit 207 may activate the comparison control signal CTR_COM when the internal information storage flag F_IFA is activated in the internal information storage operation. The information storage circuit 207 may activate the comparison control signal CTR_COM when the external information storage flag F_EFA is activated in the external information storage operation. Namely, the information storage circuit 207 may activate the comparison control signal CTR_COM when one of the internal information storage flag F_IFA and the external information storage flag F_EFA is activated.

The information storage circuit 207 may control whether to activate the comparison control signal CTR_COM, based on the comparison control mode signal SPPR_PRE and the match signal MATCH. The information storage circuit 207 may inactivate the comparison control signal CTR_COM when the match signal MATCH is activated in the comparison control operation of the external information reception mode. The match signal MATCH may include a plurality of match signals MATCH_1 to MATCH_N. The match signal MATCH may be activated to control whether to activate the comparison control signal CTR_COM, when the comparison control operation is performed in the external information reception mode. For example, the first match signal MATCH_1 may be activated to inactivate the first comparison control signal CTR_COM_1 when the comparison control operation is performed in the external information reception mode. The second match signal MATCH_2 may be activated to inactivate the second comparison control signal CTR_COM_2 when the comparison control operation is performed in the external information reception mode. Accordingly, the information storage circuit 207 may control, in advance, the repair operation based on the match signal MATCH in the external information reception mode so that the repair operation is not performed on the internal failure information IFA the same as the external failure information EFA applied from the outside, thereby preventing an abnormal operation that occurs when the external failure information EFA and the internal failure information IFA are the same in the repair operation. Also, the information storage circuit 207 may control, in advance, the repair operation based on the match signal MATCH in the external information reception mode so that the repair operation is not performed on the external failure information EFA the same as the external failure information EFA applied from the outside, thereby preventing an abnormal operation that occurs when the external failure information EFA are the same in the repair operation.

The N^th failure information storage circuit 207_N may generate the N^th failure information FA_N and the N^th comparison control signal CTR_COM_N from the N^th internal failure information IFA _N, the N^th internal information storage flag F_IFA_N, the external failure information EFA and the external information storage flag F_EFA, based on the N^th storage area signal SEL_N, the comparison control mode signal SPPR_PRE, the information storage node signal SPPR_MAIN and the N^th match signal MATCH_N.

The N^th failure information storage circuit 207_N may store one of the N^th internal failure information IFA_N and the external failure information EFA as the N^th failure information FA_N based on the N^th storage area signal SEL_N. The N^th failure information storage circuit 207_N may store the N^th internal failure information IFA_N as the N^th failure information FA_N when the N^th storage area signal SEL_N is activated in the internal information storage operation. The N^th failure information storage circuit 207_N may store the external failure information EFA as the N^th failure information FA_N when the N^th storage area signal SEL_N is activated in the external information storage operation.

The N^th failure information storage circuit 207_N may receive and store the N^th internal information storage flag F_IFA_N and the external information storage flag F_EFA based on the N^th storage area signal SEL_N and the information storage mode signal SPPR_MAIN. When the N^th storage area signal SEL_N is activated in the internal information storage operation, the N^th failure information storage circuit 207_N may store the activated N^th internal information storage flag F_IFA_N. When the N^th storage area signal SEL_N is activated in the external information storage operation of the external information reception mode, the N^th failure information storage circuit 207_N may store the activated external information storage flag F_EFA.

The N^th failure information storage circuit 207_N may generate the N^th comparison control signal CTR_COM_N from the stored N^th internal information storage flag F_IFA_N and the stored external information storage flag F_EFA. When the N^th internal information storage flag F_IFA_N is activated in the internal information storage operation, the N^th failure information storage circuit 207_N may activate the N^th comparison control signal CTR_COM_N. When the external information storage flag F_EFA is activated in the external information storage operation of the external information reception mode, the N^th failure information storage circuit 207_N may activate the N^th comparison control signal CTR_COM_N. That is to say, when one of the N^th internal information storage flag F_IFA_N and the external information storage flag F_EFA is activated, the N^th failure information storage circuit 207_N may activate the N^th comparison control signal CTR_COM_N.

The N^th failure information storage circuit 207_N may control whether to activate the N^th comparison control signal CTR_COM_N, based on the comparison control mode signal SPPR_PRE and the N^th match signal MATCH_N. When the N^th match signal MATCH_N is activated in the comparison control operation of the external information reception mode, the N^th failure information storage circuit 207_N may inactivate the N^th comparison control signal CTR_COM_N. The configuration and operation of the N^th failure information storage circuit 207_N will be described later with reference to FIG. 4.

The information comparison circuit 209 may include the plurality of failure information comparison circuits (FA COM) 209_1 to 209_N. The information comparison circuit 209 may generate the match signal MATCH by comparing the failure information FA with one of a combination of the row address RA and the external failure information EFA based on the comparison control signal CTR_COM and the comparison control mode signal SPPR_PRE. The row address RA may be generated from the external address ADD when the active operation is performed. When the comparison control signal CTR_COM is activated, the information comparison circuit 209 may generate the match signal MATCH by comparing the failure information FA with one of a combination of the row address RA and the external failure information EFA. The information comparison circuit 209 may inactivate the match signal MATCH when the comparison control signal CTR_COM is inactivated.

When the comparison control signal CTR_COM is activated in the active operation, the information comparison circuit 209 may generate the match signal MATCH by comparing a combination of the row address RA with the failure information FA. When the comparison control signal CTR_COM is activated in the active operation and a combination of the row address RA and the failure information FA are the same, the information comparison circuit 209 may activate the match signal MATCH. When the comparison control signal CTR_COM is activated in the active operation and a combination of the row address RA and the failure information FA are different, the information comparison circuit 209 may inactivate the match signal MATCH.

When the comparison control signal CTR_COM is activated in the comparison control operation based on the comparison control mode signal SPPR_PRE, the information comparison circuit 209 may generate the match signal MATCH by comparing the external failure information EFA with the failure information FA. When the comparison control signal CTR_COM is activated in the comparison control operation and the external failure information EFA and the failure information FA are the same, the information comparison circuit 209 may activate the match signal MATCH. When the comparison control signal CTR_COM is activated in the comparison control operation and the external failure information EFA and the failure information FA are different, the information comparison circuit 209 may inactivate the match signal MATCH.

The N^th failure information comparison circuit 209_N may generate the N^th match signal MATCH_N by comparing the N^th failure information FA_N with one of a combination of the row address RA and the external failure information EFA based on the N^th comparison control signal CTR_COM_N and the comparison control mode signal SPPR_PRE. When the N^th comparison control signal CTR_COM_N is activated, the N^th failure information comparison circuit 209_N may generate the N^th match signal MATCH_N by comparing the N^th failure information FA_N with one of a combination of the row address RA and the external failure information EFA. When the N^th comparison control signal CTR_COM_N is inactivated, the N^th failure information comparison circuit 209_N may inactivate the N^th match signal MATCH_N.

When the N^th comparison control signal CTR_COM_N is activated in the active operation, the N^th failure information comparison circuit 209_N may generate the N^th match signal MATCH_N by comparing a combination of the row address RA with the N^th failure information FA_N. When the N^th comparison control signal CTR_COM_N is activated in the active operation and a combination of the row address RA and the N^th failure information FA_N are the same, the N^th failure information comparison circuit 209_N may activate the N^th match signal MATCH_N. When the N^th comparison control signal CTR_COM_N is activated in the active operation and a combination of the row address RA and the N^th failure information FA_N are different, the N^th failure information comparison circuit 209_N may inactivate the N^th match signal MATCH_N.

When the N^th comparison control signal CTR_COM_N is activated in the comparison control operation, the N^th failure information comparison circuit 209_N may generate the N^th match signal MATCH_N by comparing the external failure information EFA with the N^th failure information FA_N. When the N^th comparison control signal CTR_COM_N is activated in the comparison control operation and the external failure information EFA and the N^th failure information FA_N are the same, the N^th failure information comparison circuit 209_N may activate the N^th match signal MATCH_N. When the N^th comparison control signal CTR_COM_N is activated in the comparison control operation and the external failure information EFA and the N^th failure information FA_N are different, the N^th failure information comparison circuit 209_N may inactivate the N^th match signal MATCH_N. The configuration and operation of the N^th failure information comparison circuit 209_N will be described later with reference to FIG. 6.

The core circuit 211 may include a row control circuit (ROW CTR) 213, the main cell array (MAIN CELL ARRAY) 215 and the redundancy cell array (REDUNDANCY CELL ARRAY) 217. The row control circuit 213 may perform the active operation and the active operation involving the repair operation, based on the third internal command ACT, the row address RA and the match signal MATCH. The third internal command ACT may be activated to perform the active operation. When the match signal MATCH is inactivated in the active operation, the row control circuit 213 may activate a word line of the main cell array 215 corresponding to a combination of the row address RA. When the match signal MATCH is activated in the active operation, the row control circuit 213 may block the input of the row address RA. When the match signal MATCH is activated in the active operation, the row control circuit 213 may perform the repair operation by activating a word line of the redundancy cell array 217 corresponding to the match signal MATCH. For example, when the first match signal MATCH_1 is activated in the active operation, the row control circuit 213 may perform the repair operation by activating a first word line of the redundancy cell array 217. When the second match signal MATCH_2 is activated in the active operation, the row control circuit 213 may perform the repair operation by activating a second word line of the redundancy cell array 217. Accordingly, as the number of match signals MATCH to be activated in the active operation involving the repair operation is set to one, the core circuit 211 may prevent an abnormal operation that occurs when a plurality of match signals MATCH are activated in the repair operation.

Figure 3:
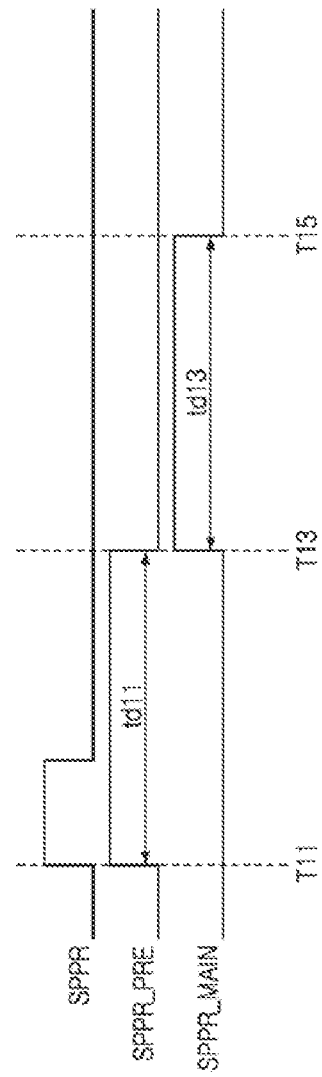
FIG. 3 is a timing diagram to assist in the explanation of an operation in which a comparison control mode signal and an information storage mode signal are generated in an operation control circuit illustrated in FIG. 2.

FIG. 3 is a timing diagram to assist in the explanation of an operation in which the comparison control mode signal SPPR_PRE and the information storage mode signal SPPR_MAIN are generated in the operation control circuit 203 illustrated in FIG. 2. At a time point T11, the operation control circuit 203 may receive the second internal command SPPR for performing the external information reception mode. At the time point T11, the operation control circuit 203 may activate the comparison control mode signal SPPR_PRE during a period td11 in which the comparison control operation is performed in the external information reception mode. At a time point T13, the operation control circuit 203 may inactivate the comparison control mode signal SPPR_PRE. At the time point T13, the operation control circuit 203 may activate the information storage mode signal SPPR_MAIN during a period td13 in which the external information storage operation is performed in the external information reception mode. At a time point T15, the operation control circuit 203 may inactivate the information storage mode signal SPPR_MAIN.

Figure 4:
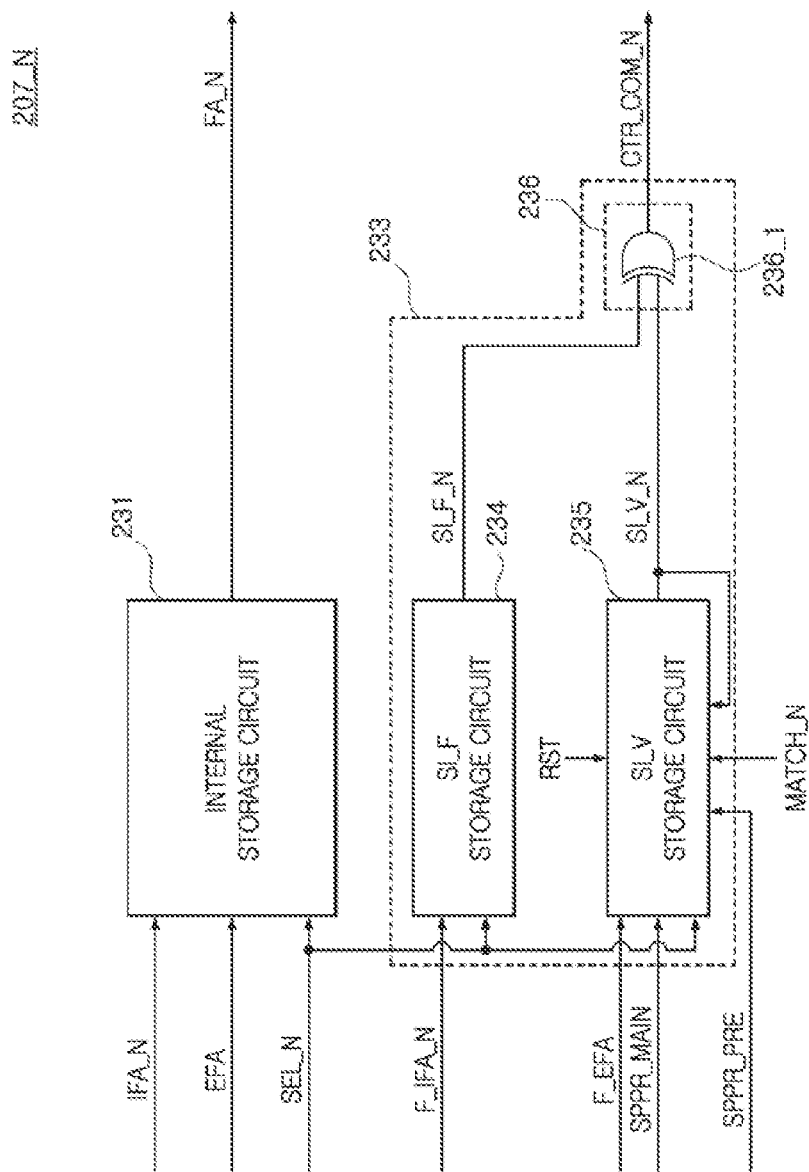
FIG. 4 is a diagram illustrating an embodiment of a failure information storage circuit illustrated in FIG. 2.

FIG. 4 is a diagram illustrating an embodiment of the N^th failure information storage circuit 207_N illustrated in FIG. 2. As illustrated in FIG. 4, the N^th failure information storage circuit 207_N may include an internal storage circuit (INTERNAL STORAGE CIRCUIT) 231 and a comparison control signal generation circuit 233.

The internal storage circuit 231 may store and output one of the N^th internal failure information IFA_N and the external failure information EFA as the N^th failure information FA_N based on the N^th storage area signal SEL_N. When the N^th storage area signal SEL_N is activated in the internal information storage operation, the internal storage circuit 231 may store and output the N^th internal failure information IFA_N as the N^th failure information FA_N. When the N^th storage area signal SEL_N is activated in the external information storage operation, the internal storage circuit 231 may store and output the external failure information EFA as the N^th failure information FA_N.

The comparison control signal generation circuit 233 may include a fixed information storage circuit (SI_F STORAGE CIRCUIT) 234, a variable information storage circuit (SI_V STORAGE CIRCUIT) 235 and a comparison control signal output circuit 236. The comparison control signal generation circuit 233 may generate the N^th comparison control signal CTR_COM_N from the N^th internal information storage flag F_IFA_N and the external information storage flag F_EFA based on the N^th storage area signal SEL_N, the comparison control mode signal SPPR_PRE, the information storage mode signal SPPR_MAIN and the N^th match signal MATCH_N. When the N^th storage area signal SEL_N is activated in the internal information storage operation, the comparison control signal generation circuit 233 may activate the N^th comparison control signal CTR_COM_N based on the activated N^th internal information storage flag F_IFA_N. When the N^th storage area signal SEL_N is activated during a period in which the information storage mode signal SPPR_MAIN is activated in the external information reception mode, the comparison control signal generation circuit 233 may activate the N^th comparison control signal CTR_COM_N based on the activated external information storage flag F_EFA. When the N^th match signal MATCH_N is activated during a period in which the comparison control mode signal SPPR_PRE is activated in the external information reception mode, the comparison control signal generation circuit 233 may control whether to activate the N^th comparison control signal CTR_COM_N. When the N^th match signal MATCH_N is activated during a period in which the comparison control mode signal SPPR_PRE is activated in the external information reception mode, the comparison control signal generation circuit 233 may inactivate the N^th comparison control signal CTR_COM_N.

The fixed information storage circuit 234 may receive the N^th internal information storage flag F_IFA_N based on the N^th storage area signal SEL_N, and may store and output the received flag as an N^th fixed information signal SI_F_N. When the N^th storage area signal SEL_N is activated in the intern& information storage operation, the fixed information storage circuit 234 may receive the activated N^th internal information storage flag F_IFA_N, and may store and output the received flag as the activated N^th fixed information signal SI_F_N.

The variable information storage circuit 235 may generate an N^th variable information signal SI_V_N based on the N^th storage area signal SEL_N, the external information storage flag F_EFA, the comparison control mode signal SPPR_PRE, the information storage mode signal SPPR_MAIN, the reset signal RST, the N^th match signal MATCH_N and the N^th variable information signal SI_V_N.

The variable information storage circuit 235 may receive the external information storage flag F_EFA based on the information storage mode signal SPPR_MAIN and the N^th storage area signal SEL_N, and may store and output the received flag as the N^th variable information signal SI_V_N. When the N^th storage area signal SEL_N is activated during a period in which the information storage mode signal SPPR_MAIN is activated in the external information reception mode, the variable information storage circuit 235 may receive the activated external information storage flag F_EFA, and may store and output the received flag as the activated N^th variable information signal SI_V_N.

The variable information storage circuit 235 may control whether to activate the N^th variable information signal SI_V_N, based on the comparison control mode signal SPPR_PRE, the N^th match signal MATCH_N and the N^th variable information signal SI_V_N. When the N^th match signal MATCH_N is activated during a period in which the comparison control mode signal SPPR_PRE is activated in the external information reception mode, the variable information storage circuit 235 may transition the logic level of the N^th variable information signal SI_V_N. For example, when the N^th match signal MATCH_N is activated during a period in which the comparison control mode signal SPPR_PRE is activated in the external information reception mode, the variable information storage circuit 235 may inactivate, to a logic low level, the N^th variable information signal SI_V_N which is activated to a logic high level. When the N^th match signal MATCH_N is activated during a period in which the comparison control signal mode SPPR_PRE is activated in the external information reception mode, the variable information storage circuit 235 may activate, to a logic high level, the N^th variable information signal SI_V_N which is inactivated to a logic low level.

The variable information storage circuit 235 may initialize the N^th variable information signal SI_V_N based on the reset signal RST. When performing the initialization operation, the variable information storage circuit 235 may inactivate the N^th variable information signal SI_V_N.

The comparison control signal output circuit 236 may generate the N^th comparison control signal CTR_COM_N based on the N^th fixed information signal SI_F_N and the N^th variable information signal SI_V_N. When one of the N^th fixed information signal SI_F_N and the N^th variable information signal SI_V_N is activated, the comparison control signal output circuit 236 may activate the N^th comparison control signal CTR_COM_N. When the N^th fixed information signal SI_F_N and the N^th variable information signal SI_V_N are inactivated, the comparison control signal output circuit 236 may inactivate the N^th comparison control signal CTR_COM_N. When the N^th fixed information signal SI_F_N and the N^th variable information signal SI_V_N are activated, the comparison control signal output circuit 236 may inactivate the N^th comparison control signal CTR_COM_N. The comparison control signal output circuit 236 may be implemented by an XOR gate 236_1. The operation of the comparison control signal generation circuit 233 will be described below with reference to FIG. 5.

Figure 5:
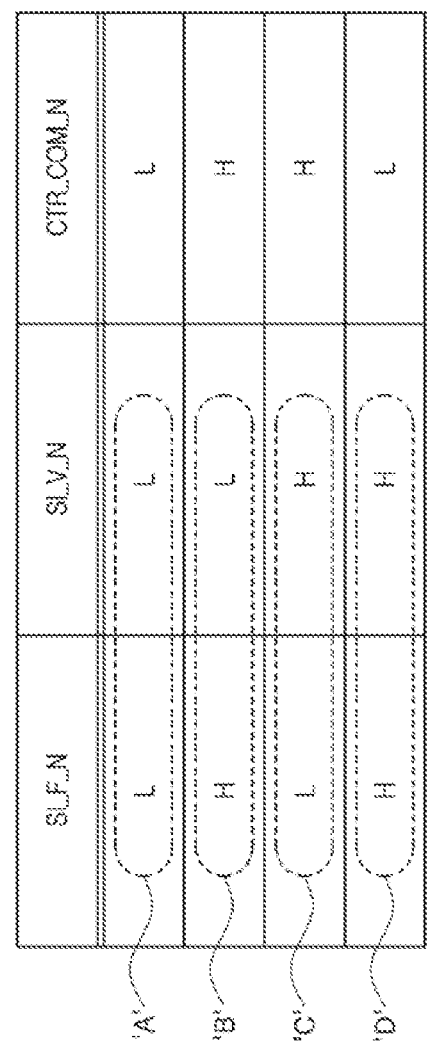
FIG. 5 is a table to assist in the explanation of the operation of a comparison control signal generation circuit illustrated in FIG. 4.

FIG. 5 is a table to assist in the explanation of an operation in which the comparison control signal generation circuit 233 illustrated in FIG. 4 generates the N^th comparison control signal CTR_COM_N based on the N^th fixed information signal SI_F_N and the N^th variable information signal SI_V_N. 'A' represents a state in which both the N^th fixed information signal SI_F_N and the N^th variable information signal SI_V_N are inactivated to logic low levels 'L.' In the case of 'A,' the comparison control signal generation circuit 233 may inactivate the N^th comparison control signal CTR_COM_N to a logic low level 'L.' 'B' represents a state in which the N^th fixed information signal SI_F_N is activated to a logic high level 'H' and the N^th variable information signal SI_V_N is inactivated to a logic low level 'L.' In the case of 'B,' the comparison control signal generation circuit 233 may activate the N^th comparison control signal CTR_COM_N to a logic high level 'H.' 'C' represents a state in which the N^th fixed information signal SI_F_N is inactivated to a logic low level 'L' and the N^th variable information signal SI_V_N is activated to a logic high level 'H.' In the case of 'C,' the comparison control signal generation circuit 233 may activate the N^th comparison control signal CTR_COM_N to a logic high level 'H.' 'D' represents a state in which both the N^th fixed information signal SI_F_N and the N^th variable information signal SI_V_N are activated to logic high levels 'H.' In the case of 'D,' the comparison control signal generation circuit 233 may inactivate the N^th comparison control signal CTR_COM_N to a logic low level 'L.'

When performing the internal information storage operation, the comparison control signal generation circuit 233 may activate the N^th fixed information signal SI_F_N from a logic low level 'L' to a logic high level 'H.' In other words, when performing the internal information storage operation, the comparison control signal generation circuit 233 may activate, to a logic high level 'H,' the N^th comparison control signal CTR_COM_N which is inactivated to a logic low level 'L' (the N^th fixed information signal SI_F_N and the N^th variable information signal SI_V_N may transition from the 'A' state to the 'B' state when the internal information storage operation is performed).

When performing the external information storage operation in the external information reception mode, the comparison control signal generation circuit 233 may activate the N^th variable information signal SI_V_N from a logic low level to a logic high level 'H.' Namely, when performing the external information storage operation in the external information reception mode, the comparison control signal generation circuit 233 may activate, to a logic high level 'H,' the N^th comparison control signal CTR_COM_N which is inactivated to a logic low level 'L' (the N^th fixed information signal SI_F_N and the N^th variable information signal SI_V_N may transition from the 'A' state to the 'C' state when the external information storage operation is performed in the external information reception mode).

When the N^th match signal MATCH_N is activated in the comparison control operation of the external information reception mode, the comparison control signal generation circuit 233 may activate, to a logic high level 'H,' the N^th variable information signal SI_V_N which is inactivated to a logic low level 'L.' That is to say, when the N^th match signal MATCH_N is activated in the comparison control operation of the external information reception mode, the comparison control signal generation circuit 233 may inactivate, to a logic low level 'L,' the N^th comparison control signal CTR_COM_N which is activated to a logic high level 'H' (the N^th fixed information signal SI_F_N and the N^th variable information signal SI_V_N may transition from the 'B' state to the 'D' state when the comparison control operation is performed in the external information reception mode). Accordingly, the comparison control signal generation circuit 233 may inactivate the N^th comparison control signal CTR_COM_N when the N^th match signal MATCH_N is activated in the 'B' state, thereby preventing an abnormal operation that occurs when the failure information FA (see FIG. 2) stored as the external failure information EFA (see FIG. 2) and the failure information FA (see FIG. 2) stored as the internal failure information IFA (see FIG. 2) are the same in the repair operation.

When the N^th match signal MATCH_N is activated in the comparison control operation of the external information reception mode, the comparison control signal generation circuit 233 may inactivate, to a logic low level 'L,' the N^th variable information signal SI_V_N which is activated to a logic high level 'H.' In other words, when the N^th match signal MATCH_N is activated in the comparison control operation of the external information reception mode, the comparison control signal generation circuit 233 may inactivate, to a logic low level 'L,' the N^th comparison control signal CTR_COM_N which is activated to a logic high level 'H' (the N^th fixed information signal SI_F_N and the N^th variable information signal SI_V_N may transition from the 'C' state to the 'A' state when the comparison control operation is performed in the external information reception mode). Accordingly, the comparison control signal generation circuit 233 may inactivate the N^th comparison control signal CTR_COM_N when the N^th match signal MATCH_N is activated in the 'C' state, thereby preventing an abnormal operation that occurs when the failure information FA (see FIG. 2) stored as the external failure information EFA (see FIG. 2) are the same in the repair operation.

When performing the initialization operation, the comparison control signal generation circuit 233 may inactivate the N^th variable information signal SI_V_N to a logic low level 'L' (the N^th fixed information signal SI_F_N and the N^th variable information signal SI_V_N may transition to the 'A' state or the 'B' state when the initialization operation is performed).

Figure 6:
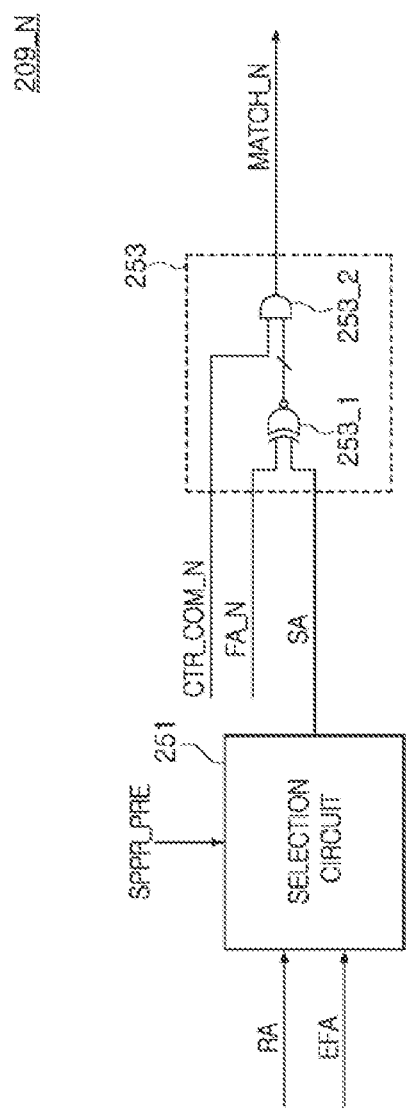
FIG. 6 is a diagram illustrating an embodiment of a failure information comparison circuit illustrated in FIG. 2.

FIG. 6 is a diagram illustrating an embodiment of the N^th failure information comparison circuit 209_N illustrated in FIG. 2. As illustrated in FIG. 6, the N^th failure information comparison circuit 209_N may include an information selection circuit 251 and an internal failure information comparison circuit 253.

The information selection circuit 251 may select one of the row address RA and the external failure information EFA based on the comparison control mode signal SPPR_PRE, and may output the selected one as selected comparison information SA. When the comparison control mode signal SPPR_PRE is inactivated in the active operation, the information selection circuit 251 may output the row address RA as the selected comparison information SA. When the comparison control mode signal SPPR_PRE is activated in the comparison control operation of the external information reception mode, the information selection circuit 251 may output the external failure information EFA as the selected comparison information SA.

The internal failure information comparison circuit 253 may generate the N^th match signal MATCH_N by comparing the selected comparison information SA with the N^th failure information FA_N based on the N^th comparison control signal CTR_COM_N. When the N^th comparison control signal CTR_COM_N is activated, the internal failure information comparison circuit 253 may compare the selected comparison information SA with the N^th failure information FA_N. When the N^th comparison control signal CTR_COM_N is activated and the selected comparison information SA and the N^th failure information FA_N are the same, the internal failure information comparison circuit 253 may activate the N^th match signal MATCH_N. When the N^th comparison control signal CTR_COM_N is activated and the selected comparison information SA and the N^th failure information FA_N are different, the internal failure information comparison circuit 253 may inactivate the N^th match signal MATCH_N. When the N^th comparison control signal CTR_COM_N is inactivated, the internal failure information comparison circuit 253 may inactivate the N^th match signal MATCH_N. The internal failure information comparison circuit 253 may include an XNOR gate 253_1 and an AND gate 253_2. When a logic level combination of the selected comparison information SA and a logic level combination of the N^th failure information FA_N are the same, the XNOR gate 253_1. may output a signal, activated to a logic high level, to one of the input terminals of the AND gate 253_2. When a logic level combination of the selected comparison information SA and a logic level combination of the N^th failure information FA_N are different, the XNOR gate 253_1 may output a signal, inactivated to a logic low level, to one of the input terminals of the AND gate 253_2. When the N^th comparison control signal CTR_COM_N is inactivated to a logic low level, the AND gate 253_2 may inactivate the N^th match signal MATCH_N to a logic low level. When the N^th comparison control signal CTR_COM_N is activated to a logic high level, the AND gate 253_2 may buffer the output signal of the XNOR gate 253_1, and may output the buffered signal as the N^th match signal MATCH_N.

FIG. 7 is a diagram to assist in the explanation of an operation in which the second apparatus 120 illustrated in FIG. 2 stores external failure information EFA, having information different from information of the previously stored internal failure information IFA, in the external information reception mode. Referring to FIG. 7, the second apparatus 120 may perform an external information reception mode OP12 after performing an internal information storage operation OP11.

The internal failure information storage circuit 201 may output the first internal failure information IFA_1 and the second internal failure information when performing the internal information storage operation OP11. The first internal failure information IFA_1 may have a first combination RA1 of a row address. The second internal failure information IFA_2 may have a second combination RA2 of the row address.

The storage area signal generation circuit 205 may activate the first and second storage area signals SEL_1 and SEL_2 when performing the internal information storage operation OP11.

The first failure information storage circuit (FIRST FA STORAGE CIRCUIT) 207_1 may store the first internal failure information IFA_1 (see FIG. 4) as the first failure information FA_1 (see FIG. 4), based on the first storage area signal SEL_1 (see FIG. 4) which is activated when the internal information storage operation OP11 is performed. The first failure information storage circuit 207_1 may store a first fixed information signal SI_F_1 (see FIG. 4) which is activated to a logic high level 'H,' based on the first storage area signal SEL_1 (see FIG. 4) which is activated when the internal information storage operation OP11 is performed, and may activate the first comparison control signal CTR_COM_1 (see FIG. 4).

The second failure information storage circuit (SECOND FA STORAGE CIRCUIT) 207_2 may store the second internal failure information IFA_2 (see FIG. 4) as the second failure information FA_2 (see FIG. 4), based on the second storage area signal SEL_2 (see FIG. 4) which is activated when the internal information storage operation OP11 is performed. The second failure information storage circuit 207_2 may store a second fixed information signal SI_F_2 (see FIG. 4) which is activated to a logic high level 'H,' based on the second storage area signal SEL_2 (see FIG. 4) which is activated when the internal information storage operation OP11 is performed, and may activate the second comparison control signal CTR_COM_2 (see FIG. 4).

The operation control circuit 203 may output the external failure information EFA having a third combination RA3 of the row address when performing the external information reception mode OP12.

The information comparison circuit 209 may inactivate the first and second match signals MATCH_1 and MATCH_2 when the external failure information EFA and the first and second failure information FA_1 and FA_2 (see FIG. 4) are different, based on the first and second comparison control signals CTR_COM_1 and CTR_COM_2 which are activated in the comparison control operation of the external information reception mode OP12.

The storage area signal generation circuit 205 may activate the third storage area signal SEL_3 when performing the external information storage operation of the external information reception mode OP12.

When performing the external information storage operation in the external information reception mode OP12, the third failure information storage circuit (THIRD FA STORAGE CIRCUIT) 207_3 may store the external failure information EFA (see FIG. 4) as the third failure information FA_3 (see FIG. 4), based on the activated third storage area signal SEL_3 (see FIG. 4). When performing the external information storage operation in the external information reception mode OP12, the third failure information storage circuit 207_3 may store a third variable information signal SI_V_3 (see FIG. 4), which is activated to a logic high level 'H,' based on the activated third storage area signal SEL_3 (see FIG. 4), and may activate the third comparison control signal CTR_COM_3 (see FIG. 4).

FIG. 8 is a diagram to assist in the explanation of an operation in which the second apparatus 120 illustrated in FIG. 2 stores the external failure information EFA, having the same information as the information of the previously stored internal failure information IFA and the previously stored external failure information EFA, in the external information reception mode. Referring to FIG. 8, the second apparatus 120 may sequentially perform an internal information storage operation OP21, a first external information reception mode OP22 and a second external information reception mode OP23. Since the internal information storage operation OP21 is performed in the same manner as the internal information storage operation OP11 illustrated in FIG. 7, detailed description thereof will be omitted herein.

The operation control circuit 203 may output the external failure information EFA having the first combination RA1 of the row address when performing the first external information reception mode OP22.

When the external failure information EFA is the same as the first failure information FA_1 based on the first comparison control signal CTR_COM_1 activated in the comparison control operation of the first external information reception mode OP22, the information comparison circuit 209 may activate the first match signal MATCH_1.

When the first match signal MATCH_1 (see FIG. 4) is activated in the comparison control operation of the first external information reception mode OP22, the first failure information storage circuit (FIRST FA STORAGE CIRCUIT) 207_1 may activate, to a logic high level 'H,' a first variable information signal SI_V_1 (see FIG. 4) which is inactivated to a logic low level 'L.' The first failure information storage circuit 207_1 may inactivate the first comparison control signal CTR_COM_1 (see FIG. 4), based on the first fixed information signal SI_F_1 (see FIG. 4) and the first variable information signal SI_V_1 (see FIG. 4) which are activated to logic high levels 'H.'

The storage area signal generation circuit 205 may activate the third storage area signal SEL_3 when performing the external information storage operation of the first external information reception mode OP22.

When performing the external information storage operation in the first external information reception mode OP22, the third failure information storage circuit (THIRD FA STORAGE CIRCUIT) 207_3 may store the external failure information EFA (see FIG. 4) as the third failure information FA_3 (see FIG. 4), based on the activated third storage area signal SEL_3 (see FIG. 4). When performing the external information storage operation in the first external information reception mode OP22, the third failure information storage circuit 207_3 may store a third variable information signal SI_V_3 (see FIG. 4) which is activated to a logic high level 'H,' based on the activated third storage area signal SEL_3 (see FIG. 4), and may activate the third comparison control signal CTR_COM_3 (see FIG. 4).

The operation control circuit 203 may output the external failure information EFA having the first combination RA1 of the row address when performing the second external information reception mode OP23.

When the external failure information EFA and the third failure information FA_3 are the same based on the third comparison control signal CTR_COM_3 activated in the comparison control operation of the second external information reception mode OP23, the information comparison circuit 209 may activate the third match signal MATCH_3.

When the third match signal MATCH_3 (see FIG. 4) is activated in the comparison control operation of the second external information reception mode OP23, the third failure information storage circuit 207_3 may inactivate, to a logic low level 'L,' the third variable information signal SI_V_3 (see FIG. 4) which is activated to a logic high level 'H.' The third failure information storage circuit 207_3 may inactivate the third comparison control signal CTR_COM_3 (see FIG. 4), based on a third fixed information signal SI_F_3 (see FIG. 4) and the third variable information signal (see FIG. 4) which are inactivated to logic low levels 'L.'

The storage area signal generation circuit 205 may activate the fourth storage area signal SEL_4 when performing the external information storage operation of the second external information reception mode OP23.

When performing the external information storage operation in the second external information reception mode OP23, the fourth failure information storage circuit (FOURTH FA STORAGE CIRCUIT) 207_4 may store the external failure information EFA (see FIG. 4) as the fourth failure information FA_4 (see FIG. 4), based on the activated fourth storage area signal SEL_4 (see FIG. 4). When performing the external information storage operation in the second external information reception mode OP23, the fourth failure information storage circuit 207_4 may store a fourth variable information signal SI_V_4 (see FIG. 4) which is activated to a logic high level 'H,' based on the activated fourth storage area signal SEL_4 (see FIG. 4), and may activate the fourth comparison control signal CTR_COM_4 (see FIG. 4).

FIG. 9 is a diagram to assist in the explanation of an operation in which the second apparatus 120 illustrated in FIG. 2 stores external failure information EFA having information different from information of the previously stored external failure information EFA in the external information reception mode, and an initialization operation for the external information reception mode. Referring to FIG. 9, the second apparatus 120 may sequentially perform an internal information storage operation OP31, a first external information reception mode OP32, a second external information reception mode OP33 and an initialization operation OP34. Since the internal information storage operation OP31 and the first external information reception mode OP32 are performed in the same manner as the internal information storage operation OP21 and the first external information reception mode OP22 illustrated in FIG. 8, detailed description thereof will be omitted herein.

The operation control circuit 203 may output the external failure information EFA having the third combination RA3 of the row address when performing the second external information reception mode OP33.

When the external failure information EFA and the second and third failure information FA_2 and FA_3 are different based on the second and third comparison control signals CTR_COM_2 and CTR_COM_3 activated in the comparison control operation of the second external information reception mode OP33, the information comparison circuit 209 may inactivate the second and third match signals MATCH_2 and MATCH_3.

The storage area signal generation circuit 205 may activate the fourth storage area signal SEL_4 when performing the external information storage operation of the second external information reception mode OP33.

When performing the external information storage operation in the second external information reception mode OP33, the fourth failure information storage circuit (FOURTH FA STORAGE CIRCUIT) 207_4 may store the external failure information EFA (see FIG. 4) as the fourth failure information FA_4 (see FIG. 4), based on the activated fourth storage area signal SEL_4 (see FIG. 4). When performing the external information storage operation in the second external information reception mode OP33, the fourth failure information storage circuit 207_4 may store a fourth variable information signal SI_V_4 (see FIG. 4) which is activated to a logic high level 'H,' based on the activated fourth storage area signal SEL_4 (see FIG. 4), and may activate the fourth comparison control signal CTR_COM_4 (see FIG. 4).

When performing the initialization operation OP34, the storage area signal generation circuit 205 may initialize information set in the capacity information D_CAP.

When performing the initializing operation, the first, second, third and fourth failure information storage circuits 207_1, 207_2, 207_3 and 207_4 may inactivate the first, second, third and fourth variable information signals SI_V_1, SI_V_2, SI_V_3 and SI_V_4 (see FIG. 4) to logic low levels 'L,' respectively.

Figure 10:
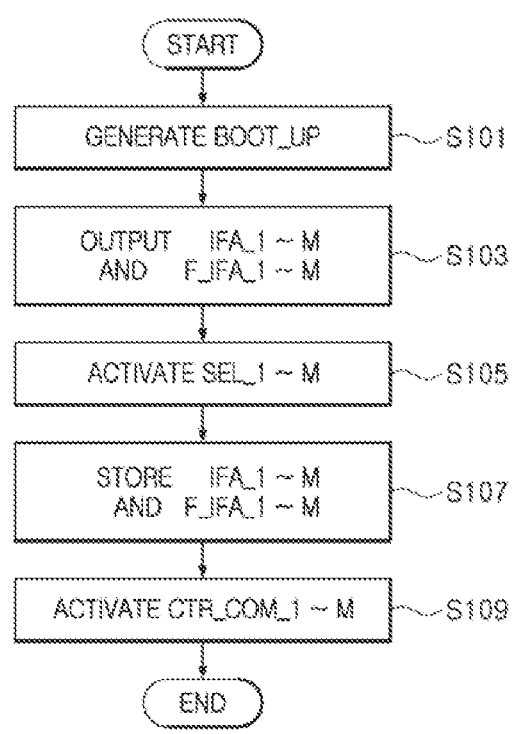
FIGS. 10, 11, and 12 are flow charts to assist in the explanation of operations that are performed in the second apparatus illustrated in FIG. 2.

FIG. 10 is a flow chart to assist in the explanation of the internal information storage operation performed in the second apparatus 120 illustrated in FIG. 2.

At step S101, the second apparatus 120 may generate the first internal command BOOT_UP, based on the external command CMD (see FIG. 1) received from the first apparatus 110 (see FIG. 1) and having a logic level combination for performing the internal information storage operation.

At step S103, the internal information storage circuit 201 may output the first to M^th internal failure information IFA_1 to IFA_M, the first to M^th internal information storage flags F_IFA_1 to F_IFA_M and the capacity information D_CAP, based on the first internal command BOOT_UP. As used herein, the tilde "~" indicates a range of components. For example, "IFA_1~M" indicates the first to M^th internal failure information IFA_1, IFA_2, . . . , and IFA_M shown in FIG. 10.

At step S105, the storage area signal generation circuit 205 may activate the first to M^th storage area signals SEL_1 to SEL_M based on the first internal command BOOT_UP and the capacity information D_CAP.

At step S107, the information storage circuit 207 may store the first to M^th internal failure information IFA_1 to IFA_M and the first to M^th internal information storage flags F_IFA_1 to F_IFA_M in the first to M^th failure information storage circuits 207_1 to 207_M, based on the activated first to M^th storage area signals SEL_1 to SEL_M, respectively.

At step S109, the first to M^th failure information storage circuits 207_1 to 207_M may activate the first to M^th comparison control signals CTR_COM_1 to CTR_COM_M based on the activated first to M^th internal information storage flags F_IFA_1 to F_IFA_M, respectively.

Figure 11:
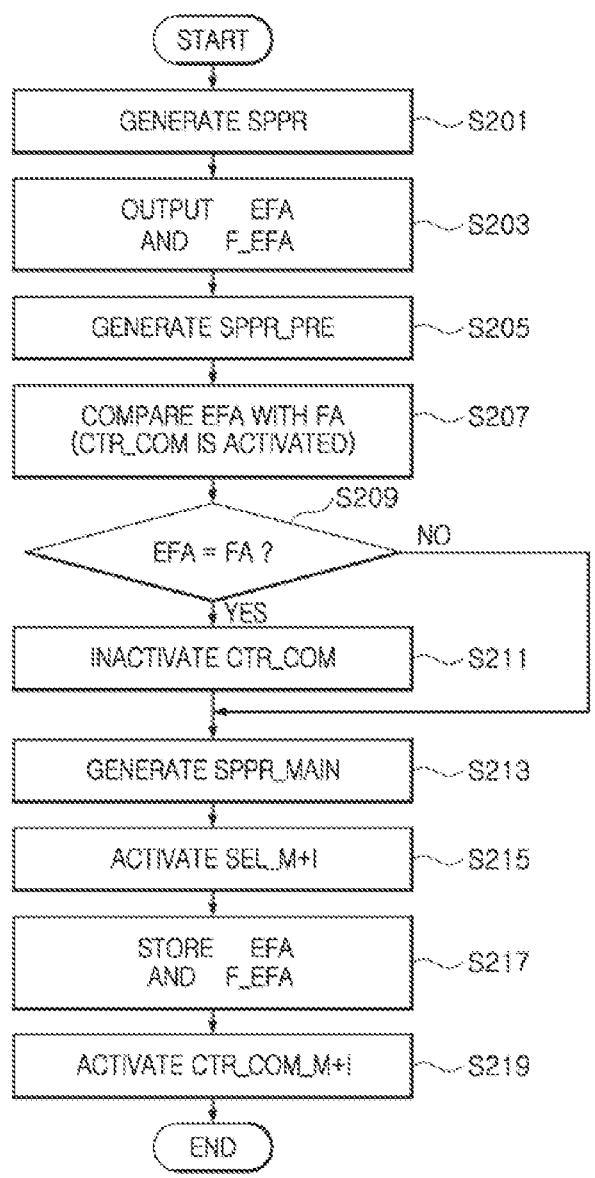

FIG. 11 is a flow chart to assist in the explanation of the external information reception mode performed in the second apparatus 120 illustrated in FIG. 2.

At step S201, the second apparatus 120 may generate the second internal command SPPR, based on the external command CMD (see FIG. 1) received from the first apparatus 110 (see FIG. 1) and having a logic level combination for performing the external information reception operation.

At step S203, the operation control circuit 203 may output the external failure information EFA and external information storage flag F_EFA based on the second internal command SPPR and external address ADD.

At step S205, the operation control circuit 203 may generate the comparison control mode signal SPPR_PRE for performing the comparison control operation, based on the second internal command SPPR.

At step S207, when the comparison control signal CTR_COM is activated, the information comparison circuit 209 may compare the external failure information EFA with the failure information FA.

At step S209, the information comparison circuit 209 may activate the match signal MATCH when the external failure information EFA and the failure information FA are the same. The information comparison circuit 209 may inactivate the match signal MATCH when the external failure information EFA and the failure information FA are different.

At step S211, when the match signal MATCH is activated (S209), the information storage circuit 207 may inactivate the comparison control signal CTR_COM.

At step S213, the operation control circuit 203 may generate the information storage mode signal SPPR_MAIN for performing the external information storage operation, based on the second internal command SPPR.

At step S215, the storage area signal generation circuit 205 may activate the (M+I)^th storage area signal SEL_M+I based on the information storage mode signal SPPR_MAIN and the capacity information D_CAP.

At step S217, the information storage circuit 207 may store the external failure information EFA and the external information storage flag F_EFA in the (M+I)^th failure information storage circuit 207_M+I, based on the activated (M+I)^th storage area signal SEL_M+I.

At step S219, the (M+I)^th failure information storage circuit 207_M+I may activate the (M+I)^th comparison control signal CTR_COM_M+I based on the external information storage flag F_EFA.

Figure 12:
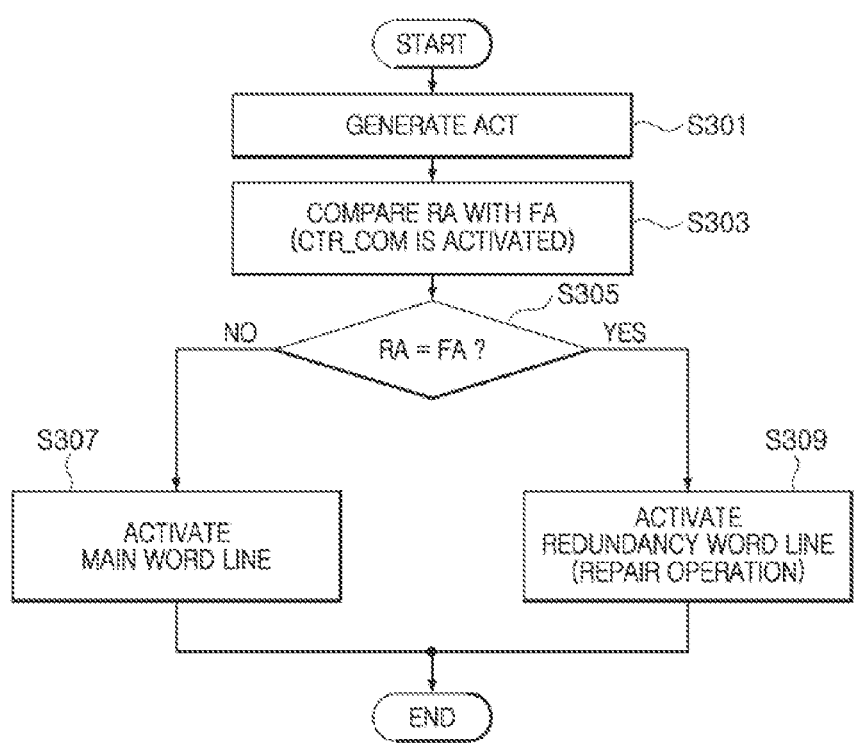

FIG. 12 is a flow chart to assist in the explanation of the active operation performed in the second apparatus 120 illustrated in FIG. 2.

At step S301, the second apparatus 120 may generate the third internal command ACT based on the external command CMD (see FIG. 1) received from the first apparatus 110 (see FIG. 1) and having a logic level combination for performing the active operation.

At step S303, when the comparison control signal CTR_COM is activated, the information comparison circuit 209 may compare a combination of the row address RA with the failure information FA.

At step S305, the information comparison circuit 209 may activate the match signal MATCH when the combination of the row address RA and the failure information FA are the same. The information comparison circuit 209 may inactivate the match signal MATCH when the combination of the row address RA and the failure information FA are different.

At step S307, when the match signal MATCH is inactivated (S305), the core circuit 211 may activate a word line of the main cell array 215 corresponding to the combination of the row address RA.

At step S309, when the match signal MATCH is activated (S305), the core circuit 211 may perform the repair operation (REPAIR OPERATION) by activating a word line of the redundancy cell array 217 corresponding to the match signal MATCH.

As is apparent from the above description, when storing, for the repair operation, the internal failure information IFA and the external failure information EFA in a storage space, the second apparatus 120 may adjust a storage capacity in which the external failure information EFA is stored, depending on the set storage capacity in which the internal failure information IFA is stored, thereby using a storage space, in which the internal failure information IFA is not stored, as a storage space for storing the external failure information EFA. Also, the second apparatus 120 may compare the external failure information EFA, applied from the outside, with the previously stored internal failure information IFA, and accordingly, may control, in advance, the repair operation so that the repair operation is not performed on the internal failure information IFA the same as the external failure information EFA, thereby preventing an abnormal operation that occurs when the external failure information EFA and the internal failure information IFA are the same in the repair operation. In addition, the second apparatus 120 may compare the external failure information EFA, applied from the outside, with the previously stored external failure information EFA, and accordingly, may control, in advance, the repair operation so that the repair operation is not performed on the external failure information EFA the same as the external failure information EFA applied from the outside, thereby preventing an abnormal operation that occurs when the external failure information EFA are the same in the repair operation.

Figure 13:
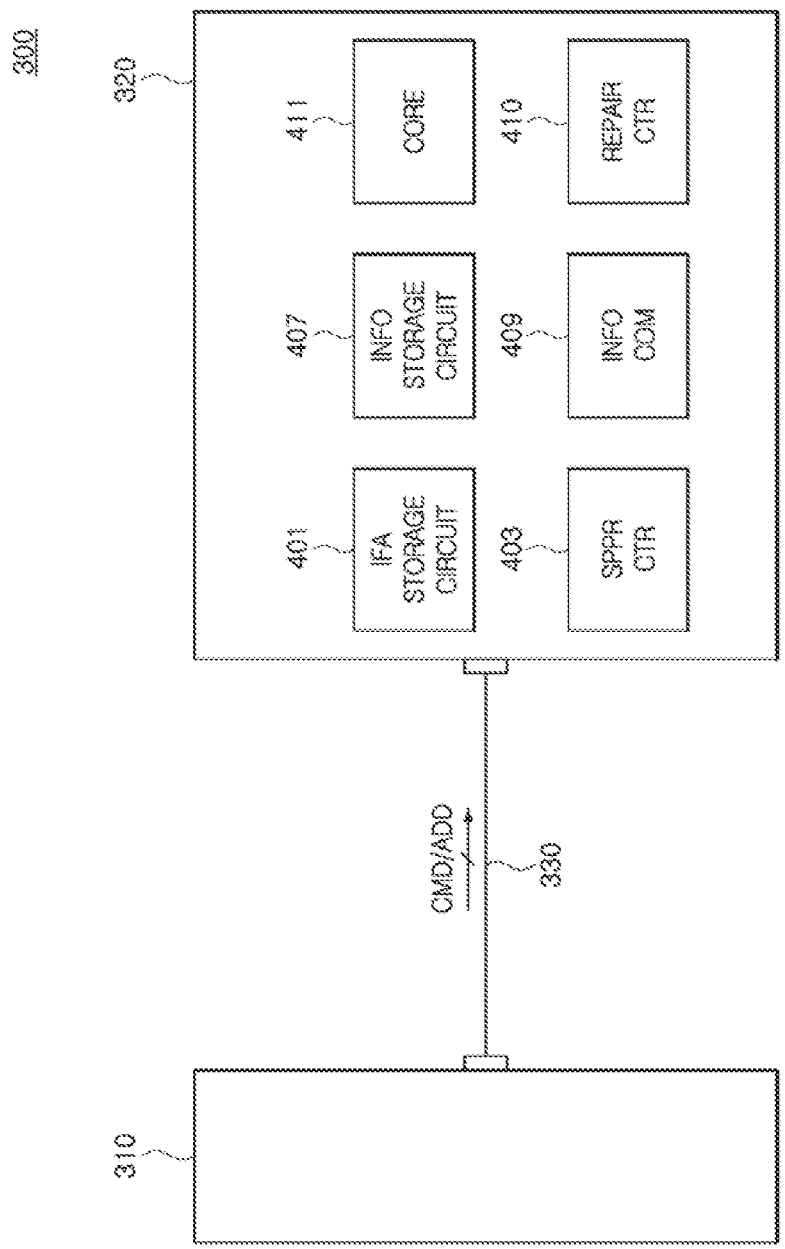
FIG. 13 is a block diagram illustrating the configuration of a system in accordance with another embodiment of the present disclosure.

FIG. 13 is a block diagram illustrating the configuration of a system 300 in accordance with another embodiment of the present disclosure. As illustrated in FIG. 13, the system 300 may include a first apparatus 310 and a second apparatus 320.

Since the first apparatus 310 is implemented in the same manner as the first apparatus 110 illustrated in FIG. 1, description for the detailed operation thereof will be omitted herein.

The second apparatus 320 may include an internal failure information storage circuit (IFA STORAGE CIRCUIT) 401, an operation control circuit (SPPR CTR) 403, an information storage circuit (INFO STORAGE CIRCUIT) 407, an information comparison circuit (INFO COM) 409, a repair control circuit (REPAIR CTR) 410 and a core circuit (CORE) 411. The second apparatus 320 may be implemented by a semiconductor apparatus. The second apparatus 320 may perform various internal operations including an internal information storage operation, an external information reception mode and an active operation, by receiving an external command CMD and an external address ADD from the first apparatus 310.

The second apparatus 320 may generate a first internal command BOOT_UP (see FIG. 14), a second internal command SPPR (see FIG. 14) and a third internal command ACT (see FIG. 14), based on the external command CMD. The second apparatus 320 may generate the first internal command BOOT_UP (see FIG. 14) based on the external command CMD having a logic level combination for performing the internal information storage operation. The second apparatus 320 may generate the second internal command SPPR (see FIG. 14) based on the external command CMD having a logic level combination for performing the external information reception mode. The external information reception mode may involve an external information storage operation and a comparison control operation. The external information reception mode may be performed after the internal information storage operation is completed. The external information reception mode may include a first external information reception mode and a second external information reception mode. The second external information reception mode may be performed after the first external information reception mode is ended. The external information reception mode may be set as a soft post package repair mode in which, when the second apparatus 320 is in a package state, the second apparatus 320 receives, from the first apparatus 310, the external address ADD, having information set in external failure information EFA (see FIG. 14). The second apparatus 320 may generate the third internal command ACT (see FIG. 14) based on the external command CMD having a logic level combination for performing the active operation. The active operation may involve a repair operation.

When performing the internal information storage operation, the internal failure information storage circuit 401 may output first to M^th internal failure information IFA_1 to IFA_M (see FIG. 14) stored therein (M may be set as a natural number), When performing the external information reception mode, the operation control circuit 403 may generate the external failure information EFA (see FIG. 14) from the external address ADD applied from the first apparatus 310.

Figure 14:
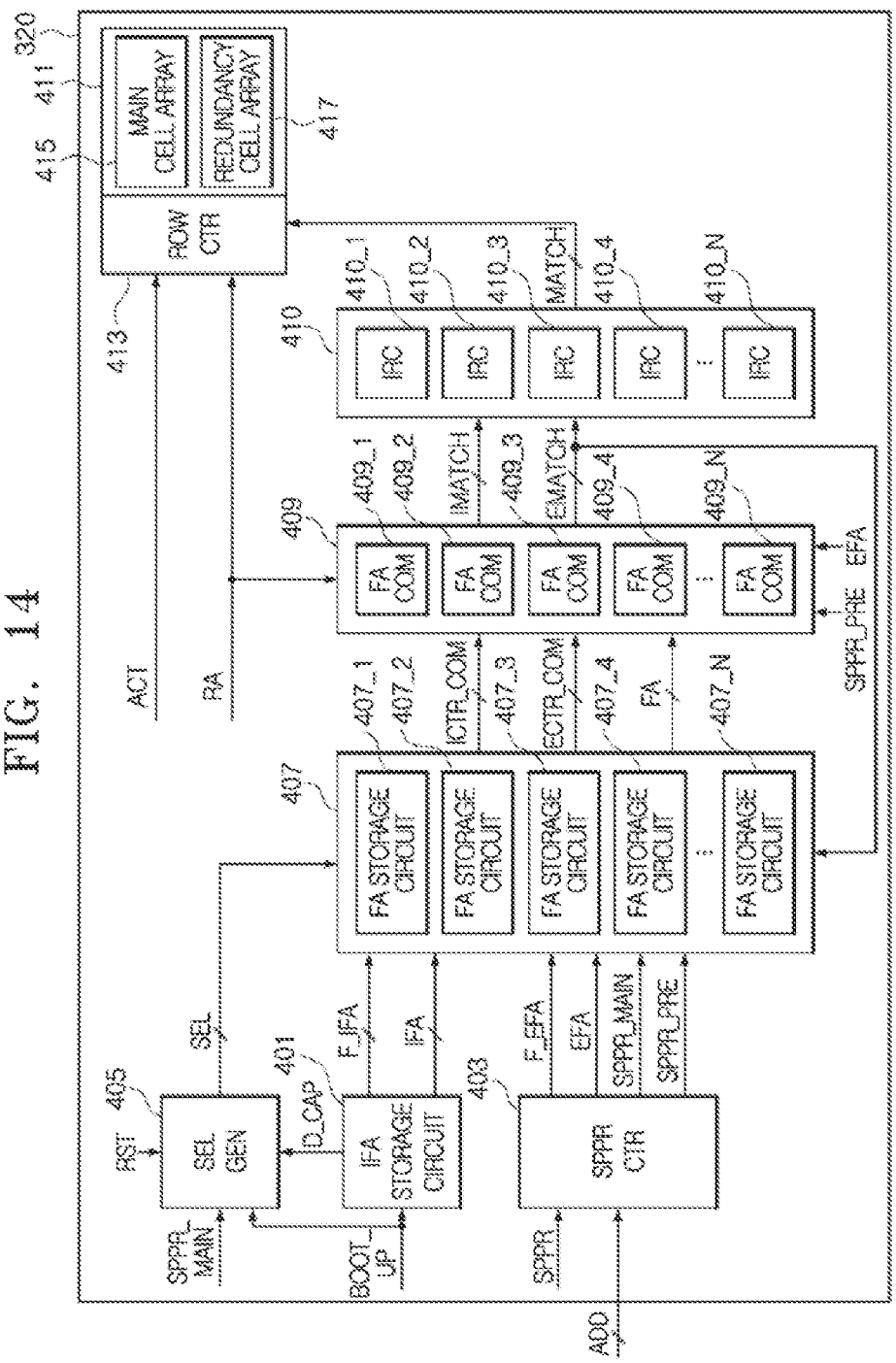
FIG. 14 is a block diagram illustrating the configuration of an embodiment of a second apparatus illustrated in FIG. 13

The information storage circuit 407 may include a plurality of failure information storage circuits 407_1 to 407_N (see FIG. 14). The plurality of failure information storage circuits 407_1 to 407_N (see FIG. 14) may each receive one of first to N^th internal failure information IFA_1 to IFA_N (see FIG. 14 where, in an embodiment, IFA may represent IFA_1 to IFA_N) and the external failure information EFA (see FIG. 14) (N may be set as a natural number equal to or greater than M), and may store received information as first to N^th failure information FA_1 to FA_N (see FIG. 14 where, in an embodiment, FA may represent FA_1 to FA_N) in first to N^th internal failure information storage circuits 407_1 to 407_N, respectively (see FIG. 14). Each of the plurality of failure information storage circuits 407_1 to 407_N (see FIG. 14) may have a unit storage capacity for storing corresponding failure information of the first to N^th failure information FA_1 to FA_N (see FIG. 14). A storage capacity of the plurality of failure information storage circuits 407_1 to 407_N (see FIG. 14) may be set as an N multiple of the unit storage capacity.

When performing the internal information storage operation, the information storage circuit 407 may store the first to M^th internal failure information IFA_1 to IFA_M (see FIG. 14) in a predetermined set storage capacity. Each time the information storage circuit 407 performs the external information storage operation, the information storage circuit 407 may store the external failure information EFA (see FIG. 14) in a variable storage capacity. The sum of the set storage capacity and the variable storage capacity may be set as the storage capacity of the plurality of failure information storage circuits 407_1 to 407_N (see FIG. 14). Accordingly, when storing, for the repair operation, internal failure information IFA (see FIG. 14) and the external failure information EFA (see FIG. 14) in a storage space, the second apparatus 320 may adjust a storage capacity for storing the external failure information EFA (see FIG. 14) depending on the set storage capacity in which the internal failure information IFA (see FIG. 14) is stored, thereby using a storage space, in which the internal failure information IFA (see FIG. 14) is not stored, as a storage space for storing the external failure information EFA (see FIG. 14).

When performing the internal information storage operation, the N^th failure information storage circuit 407_N (see FIG. 14) may store the N^th internal failure information IFA_N (see FIG. 14) as the N^th failure information FA_N (see FIG. 14), and may activate an N^th internal comparison control signal ICTR_COM_N (see FIG. 14 where, in an embodiment, ICTR_COM may represent ICTR_COM_1 to ICTR_COM_N). When performing the external information storage operation, the N^th failure information storage circuit 407_N (see FIG. 14) may store the external failure information EFA (see FIG. 14) as the N^th failure information FA_N (see FIG. 14), and may activate an N^th external comparison control signal ECTR_COM_N (see FIG. 14 where, in an embodiment, ECTR_COM may represent ECTR_COM_1 to ECTR_COM_N).

The information comparison circuit 409 may include a plurality of failure information comparison circuits 409_1 to 409_N (see FIG. 14). When performing the active operation, the N^th failure information comparison circuit 409_N (see FIG. 14) may generate an N^th internal match signal IMATCH_N (see FIG. 14 where, in an embodiment, IMATCH may represent IMATCH_1 to IMATCH_N) by comparing a combination of a row address RA (see FIG. 14) with the N^th failure information FA_N (see FIG. 14) based on the N^th internal comparison control signal ICTR_COM_N (see FIG. 14). When performing the active operation, the N^th failure information comparison circuit 409_N (see FIG. 14) may generate an N^th external match signal EMATCH_N (see FIG. 14 where, in an embodiment, EMATCH may represent EMATCH_1 to EMATCH_N) by comparing a combination of the row address RA (see FIG. 14) with the N^th failure information FA_N (see FIG. 14) based on the N^th external comparison control signal ECTR_ COM_N (see FIG. 14). When performing the external information reception mode, the N^th failure information comparison circuit 409_N (see FIG. 14) may generate the N^th external match signal EMATCH_N (see FIG. 14) by comparing the external failure information EFA (see FIG. 14) with the N^th failure information FA_N (see FIG. 14) based on the N^th external comparison control signal ECTR_ COM_N (see FIG. 14).

The repair control circuit 410 may include a plurality of internal repair control circuits 410_1 to 410_N (see FIG. 14). The N^th internal repair control circuit 410_N (see FIG. 14) may generate an N^th match signal MATCH_N (see FIG. 14 where, in an embodiment, MATCH may represent MATCH_1 to MATCH_N) for the repair operation, based on the N^th internal match signal IMATCH_N (see FIG. 14), the N^th external match signal EMATCH_N (see FIG. 14) and first to (N−1)^th external match signals EMATCH_1 to EMATCH_N−1 (see FIG. 14). When one of the N^th internal match signal IMATCH_N (see FIG. 14) and the N^th external match signal EMATCH_N (see FIG. 14) is activated, the N^th internal repair control circuit 410_N (see FIG. 14) may activate the N^th match signal MATCH_N (see FIG. 14). The N^th internal repair control circuit 410_N (see FIG. 14) may control whether to activate the N^th match signal MATCH_N, based on the first to (N−1)^th external match signals EMATCH_1 to EMATCH_N−1 (see FIG. 14).

When a match signal MATCH (see FIG. 14) is inactivated in the active operation, the core circuit 411 may activate a word line of a main cell array 415 (see FIG. 14) according to a combination of the row address RA (see FIG. 14). When the match signal MATCH (see FIG. 14) is activated in the active operation, the core circuit 411 may activate a word line of a redundancy cell array 417 (see FIG. 14) corresponding to the match signal MATCH (see FIG. 14).

When performing the internal information storage operation, the first failure information storage circuit 407_1 (see FIG. 14) may store the first internal failure information IFA_1 (see FIG. 14) as the first failure information FA_1 (see FIG. 14), and may activate a first internal comparison control signal ICTR_COM_1 (see FIG. 14). When performing the external information storage operation, the second failure information storage circuit 407_2 (see FIG. 14) may store the external failure information EFA (see FIG. 14) as the second failure information FA_2 (see FIG. 14), and may activate a second external comparison control signal ECTR_COM_2 (see FIG. 14). When the first internal comparison control signal ICTR_COM_1 (see FIG. 14) is activated in the active operation, the first failure information comparison circuit 409_1 (see FIG. 14) may compare a combination of the row address RA (see FIG. 14) with the first failure information FA_1 (see FIG. 14). When the first internal comparison control signal ICTR_COM_1 (see FIG. 14) is activated in the active operation and a combination of the row address RA (see FIG. 14) corresponds to information set in the first failure information FA_1 (see FIG. 14), the first failure information comparison circuit 409_1 (see FIG. 14) may activate the first internal match signal IMATCH_1 (see FIG. 14). When the second external comparison control signal ECTR_COM_2 (see FIG. 14) is activated in the active operation, the second failure information comparison circuit 409_2 (see FIG. 14) may compare a combination of the row address RA (see FIG. 14) with the second failure information FA_2 (see FIG. 14). When the second external comparison control signal ECTR_COM_2 (see FIG. 14) is activated in the active operation and a combination of the row address RA (see FIG. 14) and the second failure information FA_2 (see FIG. 14) are the same, the second failure information comparison circuit 409_2 (see FIG. 14) may activate the second external match signal EMATCH_2 (see FIG. 14). When the second external match signal EMATCH_2 (see FIG. 14) is activated, the first internal repair control circuit 410_1 (see FIG. 14) may inactivate a first match signal MATCH_1 (see FIG. 14). When the second external match signal EMATCH_2 (see FIG. 14) is activated, the second internal repair control circuit 410_2 (see FIG. 14) may activate a second match signal MATCH_2 (see FIG. 14). Accordingly, when performing the active operation, the second apparatus 320 may control the repair operation so that the repair operation is not performed on the internal failure information IFA (see FIG. 14) including information on the external failure information EFA (see FIG. 14), thereby preventing an abnormal operation that occurs when the internal failure information IFA (see FIG. 14) includes information set in the external failure information EFA (see FIG. 14) in the repair operation.

The first failure information storage circuit 407_1 (see FIG. 14) may store the external failure information EFA (see FIG. 14), applied in the first external information reception mode, as the first failure information FA_1 (see FIG. 14), and may activate a first external comparison control signal ECTR_COM_1 (see FIG. 14), When the first external comparison control signal ECTR_COM_1 (see FIG. 14) is activated in the second external information reception mode, the first failure information comparison circuit 409_1 (see FIG. 14) may compare the external failure information EFA (see FIG. 14), applied in the second external information reception mode, with the first failure information FA_1 (see FIG. 14). When the first external comparison control signal ECTR_COM_1 (see FIG. 14) is activated in the second external information reception mode and the external failure information EFA (see FIG. 14), applied in the second external information reception mode, and the first failure information FA_1 (see FIG. 14) are the same, the first failure information comparison circuit 409_1 (see FIG. 14) may activate the first external match signal EMATCH_1 (see FIG. 14). When the first external match signal EMATCH_1 (see FIG. 14) is activated in the second external information reception mode, the first failure information storage circuit 407_1 (see FIG. 14) may inactivate the first external comparison control signal ECTR_COM_1 (see FIG. 14). The second failure information storage circuit 407_2 (see FIG. 14) may store the external failure information EFA (see FIG. 14), applied in the second external information reception mode, as the second failure information FA_2 (see FIG. 14), and may activate the second external comparison control signal ECTR_COM_2 (see FIG. 14). Accordingly, the second apparatus 320 may compare the external failure information EFA (see FIG. 14), applied from the outside, with the previously stored external failure information EFA (see FIG. 14), and accordingly, may control, in advance, the repair operation so that the repair operation is not performed on the external failure information EFA (see FIG. 14) the same as the external failure information EFA (see FIG. 14) applied from the outside, thereby preventing an abnormal operation that occurs when the external failure information EFA (see FIG. 14) are the same in the repair operation.

FIG. 14 is a block diagram illustrating the configuration of an embodiment of the second apparatus 320 illustrated in FIG. 13. As illustrated in FIG. 14, the second apparatus 320 may include the internal failure information storage circuit (IFA STORAGE CIRCUIT) 401, the operation control circuit (SPPR CTR) 403, a storage area signal generation circuit (SEL GEN) 405, the information storage circuit 407, the information comparison circuit 409, the repair control circuit 410 and the core circuit 411.

When performing the internal information storage operation based on the first internal command BOOT_UP, the internal failure information storage circuit 401 may output the internal failure information IFA, an internal information storage flag F_IFA and capacity information D_CAP stored therein. The first internal command BOOT_UP may be activated to perform the internal information storage operation. The internal failure information storage circuit 401 may be implemented by an array rupture e-fuse (ARE) in which a plurality of e-fuses are arranged in an array format. The internal failure information storage circuit 401 may store therein the internal failure information IFA, the internal information storage flag F_IFA and the capacity information D_CAP by programming the internal failure information IFA, the internal information storage flag F_IFA and the capacity information D_CAP in e-fuses. The internal failure information IFA may be set as information corresponding to a failed memory cell. The internal failure information IFA may include the plurality of internal failure information IFA_1 to IFA_N. The internal failure information IFA may be set as combinations of a row address corresponding to failed memory cells. The internal failure information IFA may have the number of bits different from the number of bits of the row address RA. The row address RA may have first to K^th bits. The internal failure information IFA may have first to (K−1)^th bits. For example, a first combination of the row address RA<4:1> may correspond to a first memory cell as a logic level combination 'L, L, L, L.' A second combination of the row address RA<4:1> may correspond to a second memory cell as a logic level combination 'L, L, L, H.' When set as information corresponding to the first memory cell which has faded, the first internal failure information IFA_1<4:2> may have a logic level combination 'L, L, L.' When set as information corresponding to the second memory cell which has failed, the first internal failure information IFA_1<4:2> may have a logic level combination 'L, L, L.' That is to say, the logic level combination 'L, L, L' may correspond to the first and second combinations of the row address RA<4:1>. A third combination of the row address RA<4:1> may correspond to a third memory cell as a logic level combination 'L, L, H, L.' A fourth combination of the row address RA<4:1> may correspond to a fourth memory cell as a logic level combination 'L, L, H, H.' When set as information corresponding to the third memory cell which has faded, the second internal failure information IFA_2<4:2> may have a logic level combination 'L, L, H.' When set as information corresponding to the fourth memory cell which has faded, the second internal failure information IFA_2<4:2> may have a logic level combination 'L, L, H.' That is to say, the logic level combination 'L, L, H' may correspond to the third and fourth combinations of the row address RA<4:1>. Since the internal failure information storage circuit 401 is implemented in the same manner as the internal failure information storage circuit 201 illustrated in FIG. 2, description for the detailed operation thereof will be omitted herein.

The operation control circuit 403 may generate the external failure information EFA, an external information storage flag F_EFA, a comparison control mode signal SPPR_PRE and an information storage mode signal SPPR_MAIN, based on the second internal command SPPR and the external address ADD. When performing the external information reception mode based on the second internal command SPPR, the operation control circuit 403 may generate the external failure information EFA and the external information storage flag F_EFA from the external address ADD applied from the outside. The second internal command SPPR may be activated to perform the external information reception mode. When the external information reception mode is performed, the external address ADD may be set as a combination of the row address RA corresponding to a failed memory cell. In other words, the external failure information EFA may be set as a combination of the row address RA corresponding to a failed memory cell. The external failure information EFA may have the number of bits the same as the number of bits of the row address RA. The row address RA may have the first to K^th bits. The external failure information EFA may have first to K^th bits. For example, a first combination of the row address RA<4:1> may correspond to a first memory cell as a logic level combination 'L, L, L, L.' A second combination of the row address RA<4:1> may correspond to a second memory cell as a logic level combination 'L, L, L, H.' When set as information corresponding to the first memory cell which has failed, the external failure information EFA<4:1> may have a logic level combination 'L, L, L, L' corresponding to the first combination of the row address RA<4:1>. When set as information corresponding to the second memory cell which has failed, the external failure information to EFA<4:1> may have a logic level combination 'L, L, L, H' corresponding to the second combination of the row address RA<4:1>. Since the operation control circuit 403 is implemented in the same manner as the operation control circuit 203 illustrated in FIG. 2, description for the detailed operation thereof will be omitted herein.

The storage area signal generation circuit 405 may generate a storage area signal SEL from the capacity information D_CAP based on the first intern& command BOOT_UP, the information storage mode signal SPPR_MAIN and a reset signal RST. The storage area signal SEL may include a plurality of storage area signals SEL_1 to SEL_N. The plurality of storage area signals SEL_1 to SEL_N may be generated to store the internal failure information IFA_1 to IFA_N or the external failure information EFA as the failure information FA_1 to FA_N in correspondence to the plurality of different failure information storage circuits 407_1 to 407_N, respectively. Since the storage area signal generation circuit 405 is implemented in the same manner as the storage area signal generation circuit 205 illustrated in FIG. 2, description for the detailed operation thereof will be omitted herein.

The information storage circuit 407 may include the plurality of failure information storage circuits (FA STORAGE CIRCUIT) 407_1 to 407_N. The information storage circuit 407 may generate the failure information FA, an internal comparison control signal ICTR_COM and an external comparison control signal ECTR_COM from the internal failure information IFA, the internal information storage flag F_IFA, the external failure information EFA and the external information storage flag F_EFA based on the storage area signal SEL, the comparison control mode signal SPPR_PRE, the information storage mode signal SPPR_MAIN and an external match signal EMATCH.

The information storage circuit 407 may receive the internal failure information IFA and the external failure information EFA based on the storage area signal SEL, and may store the received internal failure information IFA and external failure information EFA as the failure information FA in the plurality of failure information storage circuits 407_1 to 407_N. Each of the plurality of failure information storage circuits 407_1 to 407_N may receive one of the internal failure information IFA and the external failure information EFA, and may store the received information as the failure information FA. The failure information FA may include the plurality of failure information FA_1 to FA_N. Each of the plurality of failure information storage circuits 407_1 to 407_N may have the unit storage capacity for storing corresponding failure information of the plurality of failure information FA_1 to FA_N. A storage capacity of the plurality of failure information storage circuits 407_1 to 407_N may be set as an N multiple of the unit storage capacity.

When performing the internal information storage operation, the information storage circuit 407 may store the internal failure information IFA as the failure information FA in the set storage capacity based on the storage area signal SEL. The information storage circuit 407 may store the first to M^th internal failure information IFA_1 to IFA_M as the first to M^th failure information FA_1 to FA_M, respectively, in the first to M^th failure information storage circuits 407_1 to 407_M corresponding to the first to M^th storage area signals SEL_1 to SEL_M which are activated when performing the internal information storage operation. For example, when the first storage area signal SEL_1 is activated in the internal information storage operation, the information storage circuit 407 may store the first internal failure information IFA_1 as the first failure information FA_1 in the first failure information storage circuit 407_1. When the first and second storage area signals SEL_1 and SEL_2 are activated in the internal information storage operation, the information storage circuit 407 may store the first and second internal failure information IFA_1 and IFA_2 as the first and second failure information FA_1 and FA_2 in the first and second failure information storage circuits 407_1 and 407_2, respectively.

When performing the external information storage operation, the information storage circuit 407 may store the external failure information EFA as the failure information FA in the variable storage capacity based on the storage area signal SEL. The variable storage capacity may be set as a difference between the storage capacity of the plurality of failure information storage circuits 407_1 to 407_N and the set storage capacity. In other words, the sum of the set storage capacity and the variable storage capacity may be set as the storage capacity of the plurality of failure information storage circuits 407_1 to 407_N. Accordingly, the variable storage capacity may be adjusted depending on the set storage capacity. The information storage circuit 407 may store the external failure information EFA as (M+I)^th failure information FA_M+I in an (M+I)^th failure information storage circuit 407_M+I corresponding to the (M+I)^th storage area signal SEL_M+I which is activated each time when the information storage circuit 407 performs the external information storage operation. Accordingly, when storing, for the repair operation, the internal failure information IFA and the external failure information EFA in a storage space, the information storage circuit 407 may adjust a storage capacity in which the external failure information EFA is stored, depending on the set storage capacity in which the internal failure information IFA is stored, thereby using a storage space, in which the internal failure information IFA is not stored, as a storage space for storing the external failure information EFA.

The information storage circuit 407 may receive and store the internal information storage flag F_IFA and the external information storage flag F_EFA in the plurality of failure information storage circuits 407_1 to 407_N based on the storage area signal SEL and the information storage mode signal SPPR_MAIN. Each of the plurality of failure information storage circuits 407_1 to 407_N may store the internal information storage flag F_IFA when performing the internal information storage operation. Each of the plurality of failure information storage circuits 407_1 to 407_N may store the external information storage flag F_EFA when performing the external information storage operation. The information storage circuit 407 may store the activated first to M^th internal information storage flags F_IFA_1 to F_IFA_M in the first to M^th failure information storage circuits 407_1 to 407_M, respectively, corresponding to the first to M^th storage area signals SEL_1 to SEL_M which are activated when performing the internal information storage operation. The information storage circuit 407 may store the activated external information storage flag F_EFA in the (M+I)^th failure information storage circuit 407_M+I corresponding to the (M+I)^th storage area signal SEL_M+I which is activated each time the information storage circuit 407 performs the external information storage operation.

The information storage circuit 407 may generate the internal comparison control signal ICTR_COM from the stored internal information storage flag F_IFA. The internal comparison control signal ICTR_COM may include a plurality of internal comparison control signals ICTR_COM_1 to ICTR_COM_N. The information storage circuit 407 may activate the internal comparison control signal ICTR_COM when the internal information storage flag F_IFA is activated. The information storage circuit 407 may generate the external comparison control signal ECTR_COM from the stored external information storage flag F_EFA. The external comparison control signal ECTR_COM may include a plurality of external comparison control signals ECTR_COM_1 to ECTR_COM_N. The information storage circuit 407 may activate the external comparison control signal ECTR_COM when the external information storage flag F_EFA is activated.

The information storage circuit 407 may control whether to activate the external comparison control signal ECTR_COM, based on the comparison control mode signal SPPR_PRE and the external match signal EMATCH. The information storage circuit 407 may inactivate the external comparison control signal ECTR_COM when the external match signal EMATCH is activated in the comparison control operation of the external information reception node. The external match signal EMATCH may be activated to control whether to activate the external comparison control signal ECTR_COM, when the comparison control operation is performed in the external information reception mode. For example, the first external match signal EMATCH_1 may be activated to inactivate the first external comparison control signal ECTR_COM_1 when the comparison control operation is performed in the external information reception mode. The second external match signal EMATCH_2 may be activated to inactivate the second external comparison control signal ECTR_COM_2 when the comparison control operation is performed in the external information reception mode. Accordingly, the information storage circuit 407 may control, in advance, the repair operation based on the external match signal EMATCH in the external information reception mode so that the repair operation is not performed on the external failure information EFA the same as the external failure information EFA applied from the outside, thereby preventing an abnormal operation that occurs when the external failure information EFA are the same in the repair operation.

The N^th failure information storage circuit 407_N may generate the N^th failure information FA_N, the N^th internal comparison control signal ICTR_COM_N and the N ^th external comparison control signal ECTR_COM_N from the N ^th internal failure information IFA_N, the N ^th internal information storage flag F_IFA_N, the external failure information EFA and the external information storage flag F_EFA, based on the N^th storage area signal SEL_N, the comparison control mode signal SPPR_PRE, the information storage mode signal SPPR_MAIN and the N^th external match signal EMATCH_N.

The N^th failure information storage circuit 407_N may store one of the N^th internal failure information IFA_N and the external failure information EFA as the N^th failure information FA_N based on the N^th storage area signal SEL_N. The N^th failure information storage circuit 407_N may store the N^th internal failure information IFA_N as the N^th failure information FA_N when the N^th storage area signal SEL_N is activated in the internal information storage operation. When the N^th storage area signal SEL_N is activated in the internal information storage operation, the N^th failure information storage circuit 407_N may store the first to (K−1)^th bits IFA_N<K−1:1> of the N^th internal failure information as the first to (K−1)^th bits FA_N<K−1:1> of the N^th failure information. The K^th bit FA_N<K> of the N^th failure information may be set to a logic low level or a logic high level when the internal information storage operation is performed. The N ^th failure information storage circuit 407_N may store the external failure information EFA as the N^th failure information FA_N when the N^th storage area signal SEL_N is activated in the external information storage operation. When performing the external information storage operation, the failure information storage circuit 407_N may store the first to K^th bits EFA<K:1> of the external failure information as the first to K^th bits FA_N<K:1> of the N^th failure information.

The N^th failure information storage circuit 407_N may receive and store the N^th internal information storage flag F_IFA_N and the external information storage flag F_EFA based on the N^th storage area signal SEL_N and the information storage mode signal SPPR_MAIN. When the N^th storage area signal SEL_N is activated in the internal information storage operation, the N^th failure information storage circuit 407_N may store the activated N^th internal information storage flag F_IFA_N. When the N^th storage area signal SEL_N is activated in the external information storage operation of the external information reception mode, the N^th failure information storage circuit 407_N may store the activated external information storage flag F_EFA.

The N^th failure information storage circuit 407_N may generate the N^th internal comparison control signal ICTR_COM_N from the stored N^th internal information storage flag F_IFA_N. When the N^th internal information storage flag F_IFA_N is activated in the internal information storage operation, the N^th failure information storage circuit 407_N may activate the N^th internal comparison control signal ICTR_COM_N. The N^th failure information storage circuit 407_N may generate the N^th external comparison control signal ECTR_COM_N from the stored external information storage flag F_EFA. When the external information storage flag F_EFA is activated in the external information storage operation of the external information reception mode, the N^th failure information storage circuit 407_N may activate the N^th external comparison control signal ECTR_COM_N.

The N^th failure information storage circuit 407_N may control whether to activate the N^th external comparison control signal ECTR_COM_N, based on the comparison control mode signal SPPR_PRE and the N^th external match signal EMATCH_N. When the N^th external match signal EMATCH_N is activated in the comparison control operation of the external information reception mode, the N ^th failure information storage circuit 407_N may inactivate the N^th external comparison control signal ECTR_COM_N. The configuration and operation of the N^th failure information storage circuit 407_N will be described later with reference to FIGS. 15 and 16.

The information comparison circuit 409 may include the plurality of failure information comparison circuits (FA COM) 409_1 to 409_N. The information comparison circuit 409 may generate the internal match signal IMATCH and the external match signal EMATCH by comparing the failure information FA with one of a combination of the row address RA and the external failure information EFA based on the internal comparison control signal ICTR_COM, the external comparison control signal ECTR_COM and the comparison control mode signal SPPR_PRE. The row address RA may be generated from the external address ADD when the active operation is performed. When performing the active operation, the information comparison circuit 409 may generate the internal match signal IMATCH and the external match signal EMATCH by comparing a combination of the row address RA with the failure information FA based on the internal comparison control signal ICTR_COM and the external comparison control signal ECTR_COM. When performing the comparison control operation in the external information reception mode, the information comparison circuit 409 may generate the internal match signal IMATCH and the external match signal EMATCH by comparing the external failure information EFA with the failure information FA based on the internal comparison control signal ICTR_COM and the external comparison control signal ECTR_COM. When the internal comparison control signal ICTR_COM is activated, the information comparison circuit 409 may generate the internal match signal IMATCH by comparing the failure information FA with one of a combination of the row address RA and the external failure information EFA. When the external comparison control signal ECTR_COM is activated, the information comparison circuit 409 may generate the external match signal EMATCH by comparing the failure information FA with one of a combination of the row address RA and the external failure information EFA.

When the internal comparison control signal ICTR_COM is activated in the active operation, the information comparison circuit 409 may generate the internal match signal IMATCH by comparing a combination of the row address RA with the failure information FA. When the internal comparison control signal ICTR_COM is activated in the active operation, the information comparison circuit 409 may generate the internal match signal IMATCH by comparing the first to $(K-1)$^th bits RA<K-1:1> of the row address RA with the first to $(K-1)$^th bits FA<K-1:1> of the failure information FA. When a combination of the row address RA corresponds to information set in the failure information FA in the active operation, the information comparison circuit 409 may activate the internal match signal IMATCH. When the internal comparison control signal ICTR_COM is activated in the active operation and the first to $(K-1)$^th bits RA<K-1:1> of the row address RA and the first to $(K-1)$^th bits FA<K-1:1> of the failure information FA are the same, the information comparison circuit 409 may activate the internal match signal IMATCH. When the internal comparison control signal ICTR_COM is activated in the active operation and the first to $(K-1)$^th bits RA<K-1:1> of the row address RA and the first to $(K-1)$^th bits FA<K-1:1> of the failure information FA are different, the information comparison circuit 409 may inactivate the internal match signal IMATCH. The information comparison circuit 409 may inactivate the internal match signal IMATCH when the internal comparison control signal ICTR_COM is inactivated.

When the external comparison control signal ECTR_COM is activated in the active operation, the information comparison circuit 409 may generate the external match signal EMATCH by comparing a combination of the row address RA with the failure information FA. When the external comparison control signal ECTR_COM is activated in the active operation, the information comparison circuit 409 may generate the external match signal EMATCH by comparing the first to K^th bits RA<K:1> of the row address RA with the first to K^th bits FA<K:1> of the failure information FA. When the external comparison control signal ECTR_COM is activated in the active operation and the first to K^th bits RA<K:1> of the row address RA and the first to K^th bits FA<K:1> of the failure information FA are the same, the information comparison circuit 409 may activate the external match signal EMATCH. When the external comparison control signal ECTR_COM is activated in the active operation and the first to K^th bits RA<K:1> of the row address RA and the first to K^th bits FA<K:1> of the failure information FA are different, the information comparison circuit 409 may inactivate the external match signal EMATCH. The information comparison circuit 409 may inactivate the external match signal EMATCH when the external comparison control signal ECTR_COM is inactivated in the active operation.

When the external comparison control signal ECTR_COM is activated in the comparison control operation of the external information reception mode, the information comparison circuit 409 may generate the external match signal EMATCH by comparing the external failure information EFA with the failure information FA. When the external comparison control signal ECTR_COM is activated in the comparison control operation of the external information reception mode, the information comparison circuit 409 may generate the external match signal EMATCH by comparing the first to K^th bits EFA<K:1> of the external failure information EFA with the first to K^th bits FA<K:1> of the failure information FA. When the external comparison control signal ECTR_COM is activated in the comparison control operation of the external information reception mode and the first to K^th bits EFA<K:1> of the external failure information EFA and the first to K^th bits FA<K:1> of the failure information FA are the same, the information comparison circuit 409 may activate the external match signal EMATCH. When the external comparison control signal ECTR_COM is activated in the comparison control operation of the external information reception mode and the first to K^th bits EFA<K:1> of the external failure information EFA and the first to K^th bits FA<K:1> of the failure information FA are different, the information comparison circuit 409 may inactivate the external match signal EMATCH. The information comparison circuit 409 may inactivate the external match signal EMATCH when the external comparison control signal ECTR_COM is inactivated in the comparison control operation of the external information reception mode.

The N^th failure information comparison circuit 409_N may generate the N^th internal match signal IMATCH_N and the N^th external match signal EMATCH_N by comparing the N^th failure information FA_N with one of a combination of the row address RA and the external failure information EFA based on the N^th internal comparison control signal ICTR_COM_N, the N^th external comparison control signal ECTR_COM_N and the comparison control mode signal SPPR_PRE. When performing the active operation, the N^th failure information comparison circuit 409_N may generate the N^th internal match signal IMATCH_N and the N^th external match signal EMATCH_N by comparing a combination of the row address RA with the failure information FA based on the N^th internal comparison control signal ICTR_COM_N and the N^th external comparison control signal ECTR_COM_N. When performing the comparison control operation in the external information reception mode, the N^th failure information comparison circuit 409_N may generate the N^th internal match signal IMATCH_N and the N^th external match signal EMATCH_N by comparing the external failure information EFA with the failure information FA based on the N^th internal comparison control signal ICTR_COM_N and the N^th external comparison control signal ECTR_COM_N. When the N^th internal comparison control signal ICTR_COM_N is activated, the N^th failure information comparison circuit 409_N may generate the N^th internal match signal IMATCH_N by comparing the N^th failure information FA_N with one of a combination of the row address RA and the external failure information EFA. When the N^th external comparison control signal ECTR_COM_N is activated, the N^th failure information comparison circuit 409_N may generate the N^th external match signal EMATCH_N by comparing the N^th failure information FA_N with one of a combination of the row address RA and the external failure information EFA.

When the N^th internal comparison control signal ICTR_COM_N is activated in the active operation, the N^th failure information comparison circuit 409_N may generate the N^th Internal match signal IMATCH_N by comparing a combination of the row address RA with the N^th failure information FA_N. When the N^th internal comparison control signal ICTR_COM_N is activated in the active operation, the N^th failure information comparison circuit 409_N may generate the N^th internal match signal IMATCH_N by comparing the first to (K−1)^th bits RA<K−1:1> of the row address RA with the first to (K−1)^th bits FA_N<K−1:1> of the N^th failure information FA_N. When a combination of the row address RA corresponds to information set in the N^th failure information FA_N in the active operation, the N^th failure information comparison circuit 409_N may activate the N^th internal match signal IMATCH_N. When the N^th internal comparison control signal ICTR_COM_N is activated in the active operation and the first to (K−1)^th bits RA<K−1:1> of the row address RA and the first to (K−1)^th bits FA_N<K−1:1> of the N^th failure information FA_N are the same, the N^th failure information comparison circuit 409_N may activate the N^th internal match signal IMATCH_N. When the N^th internal comparison control signal ICTR_COM N is activated in the active operation and the first to (K−1)^th bits RA<K−1:1> of the row address RA and the first to (K−1)^th bits FA_N<K−1:1> of the N^th failure information FA_N are different, the N^th failure information comparison circuit 409_N may inactivate the N^th internal match signal IMATCH_N. When the N^th internal comparison control signal ICTR_COM_N is inactivated, the N^th failure information comparison circuit 409_N may inactivate the N^th internal match signal IMATCH_N.

When the N^th external comparison control signal ECTR_COM_N is activated in the active operation, the N^th failure information comparison circuit 409_N may generate the N^th external match signal EMATCH_N by comparing a combination of the row address RA with the N^th failure information FA_N. When the N^th external comparison control signal ECTR_COM_N is activated in the active operation, the N^th failure information comparison circuit 409_N may generate the N^th external match signal EMATCH_N by comparing the first to K^th bits RA<K:1> of the roar address RA with the first to K^th bits FA_N<K:1> of the N^th failure information FA_N. When the N^th external comparison control signal ECTR_COM_N is activated in the active operation and the first to K^th bits RA<K:1> of the row address RA and the first to K^th bits FA_N<K:1> of the N^th failure information FA_N are the same, the N^th failure information comparison circuit 409_N may activate the N^th external match signal EMATCH_N. When, in the active operation, the first to K^th bits RA<K:1> of the row address RA and the first to K^th bits FA_N<K:1> of the N^th failure information FA_N are different, the N^th failure information comparison circuit 409_N may inactivate the N^th external match signal EMATCH_N. When the N^th external comparison control signal ECTR_COM_N is inactivated in the active operation, the N^th failure information comparison circuit 409_N may inactivate the N^th external match signal EMATCH_N.

When the N^th external comparison control signal ECTR_COM_N is activated in the comparison control operation of the external information reception mode, the N^th failure information comparison circuit 409_N may generate the N^th external match signal EMATCH_N by comparing the external failure information EFA with the failure information FA. When the N^th external comparison control signal ECTR_COM_N is activated in the comparison control operation of the external information reception mode, the N^th failure information comparison circuit 409_N may generate the N^th external match signal EMATCH_N by comparing the first to K^th bits EFA<K:1> of the external failure information EFA with the first to K^th bits FA_N<K:1> of the N^th failure information FA_N. When the N ^th external comparison control signal ECTR_COM_N is activated in the comparison control operation of the external information reception mode and the first to K^th bits EFA_N<K:1> of the N^th external failure information EFA_N and the first to K^th bits FA_N<K:1> of the N^th failure information FA_N are the same, the N^th failure information comparison circuit 409_N may activate the N^th external match signal EMATCH_N. When the N^th external comparison control signal ECTR_COM_N is activated in the comparison control operation of the external information reception mode and the first to K^th bits EFA_N<K:1> of the N^th external failure information EFA_N and the first to K^th bits FA_N<K:1> of the N^th failure information FA_N are different, the N^th failure information comparison circuit 409_N may inactivate the N^th external match signal EMATCH_N. When the N^th external comparison control signal ECTR_COM_N is inactivated in the comparison control operation of the external information reception mode, the N^th failure information comparison circuit 409_N may inactivate the N^th external match signal EMATCH_N. The configuration and operation of the N^th failure information comparison circuit 409_N will be described later with reference to FIG. 17.

The repair control circuit 410 may include the plurality of internal repair control circuits (IRC) 410_1 to 410_N. The repair control circuit 410 may generate the match signal MATCH for performing the repair operation, based on the internal match signal IMATCH and the external match signal EMATCH. The match signal MATCH may include a plurality of match signals MATCH_1 to MATCH_N.

The N^th internal repair control circuit 410_N may generate the N^th match signal MATCH_N, based on the N^th internal match signal IMATCH_N, the N^th external match signal EMATCH_N and the first to (N−1)^th external match signals EMATCH_1 to EMATCH_N−1. For example, the first internal repair control circuit 410_1 may generate the first match signal MATCH_1, based on the first internal match signal IMATCH_1, the first external match signal EMATCH_1 and the second to fourth external match signals EMATCH_2 to EMATCH_4. The second internal repair control circuit 410_2 may generate the second match signal MATCH_2, based on the second internal match signal IMATCH_2, the second external match signal EMATCH_2 and the first, third and fourth external match signals EMATCH_1, EMATCH_3 and EMATCH_4.

When one of the N^th internal match signal IMATCH_N and the N^th external match signal EMATCH_N is activated, the N^th internal repair control circuit 410_N may activate the N^th match signal MATCH_N. When the N^th internal match signal IMATCH_N and the N^th external match signal EMATCH_N are inactivated, the N^th internal repair control circuit 410_N may inactivate the N^th match signal MATCH_N. For example, when one of the first internal match signal IMATCH_1 and the first external match signal EMATCH_1 is activated, the first internal repair control circuit 410_1 may activate the first match signal MATCH_1. When the first internal match signal IMATCH_1 and the first external match signal EMATCH_1 are inactivated, the first internal repair control circuit 410_1 may inactivate the first match signal MATCH_1. When one of the second internal match signal IMATCH_2 and the second external match signal EMATCH_2 is activated, the second internal repair control circuit 410_2 may activate the second match signal MATCH_2. When the second internal match signal IMATCH_2 and the second external match signal EMATCH_2 are inactivated, the second internal repair control circuit 410_2 may inactivate the second match signal MATCH_2.

The N^th internal repair control circuit 410_N may control whether to activate the N^th match signal MATCH_N, based on the first to (N-1)^th external match signals EMATCH_1 to EMATCH_N-1. The first to (N-1)^th external match signals EMATCH_1 to EMATCH_N-1 may be activated to inactivate the N^th match signal MATCH_N. The N^th internal repair control circuit 410_N may inactivate the N^th match signal MATCH_N when at least one of the first to (N-1)^th external match signals EMATCH_1 to EMATCH_N-1 is activated. When all of the first to (N-1)^th external match signals EMATCH_1 to EMATCH_N-1 are inactivated, the N^th internal repair control circuit 410_N may activate the N^th match signal MATCH_N based on the N^th internal match signal IMATCH_N which is activated. For example, the first internal repair control circuit 410_1 may control whether to activate the first match signal MATCH_1, based on the second to fourth external match signals EMATCH_2 to EMATCH_4. The second to fourth external match signals EMATCH_2 to EMATCH_4 may be activated to control whether to activate the first match signal MATCH_1. The first internal repair control circuit 410_1 may inactivate the first match signal MATCH_1 when at least one of the second to fourth external match signals EMATCH_1 to EMATCH_4 is activated. When all of the second to fourth external match signals EMATCH_2 to EMATCH_4 are inactivated, the first internal repair control circuit 410_1 may activate the first match signal MATCH_1 based on the first internal match signal IMATCH_1 which is activated. The second internal repair control circuit 4102 may control whether to activate the second match signal MATCH_2, based on the first, third and fourth external match signals EMATCH_1, EMATCH_3 and EMATCH_N4. The first, third and fourth external match signals EMATCH_1, EMATCH_3 and EMATCH_4 may be activated to control whether to activate the second match signal MATCH_2. The second internal repair control circuit 410_2 may inactivate the second match signal MATCH_2 when at least one of the first, third and fourth external match signals EMATCH_1, EMATCH_3 and EMATCH_4 is activated. When all of the first, third and fourth external match signals EMATCH_1, EMATCH_3 and EMATCH_4 are inactivated, the second internal repair control circuit 410_2 may activate the second match signal MATCH_2 based on the second internal match signal IMATCH_2 which is activated. Accordingly, the repair control circuit 410 may control whether to activate the match signal MATCH, based on the external match signal EMATCH which is generated in the active operation, thereby preventing an abnormal operation that occurs when, in the repair operation, the internal failure information IFA includes information set in the external failure information EFA.

The core circuit 411 may include a row control circuit (ROW CTR) 413, the main cell array (MAIN CELL ARRAY) 415 and the redundancy cell array (REDUNDANCY CELL ARRAY) 417. The row control circuit 413 may perform the active operation and the active operation involving the repair operation, based on the third internal command ACT, the row address RA and the match signal MATCH. The third internal command ACT may be activated to perform the active operation. Since the core circuit 411 is implemented in the same manner as the core circuit 211 illustrated in FIG. 2, detailed description thereof will be omitted herein.

Figure 15:
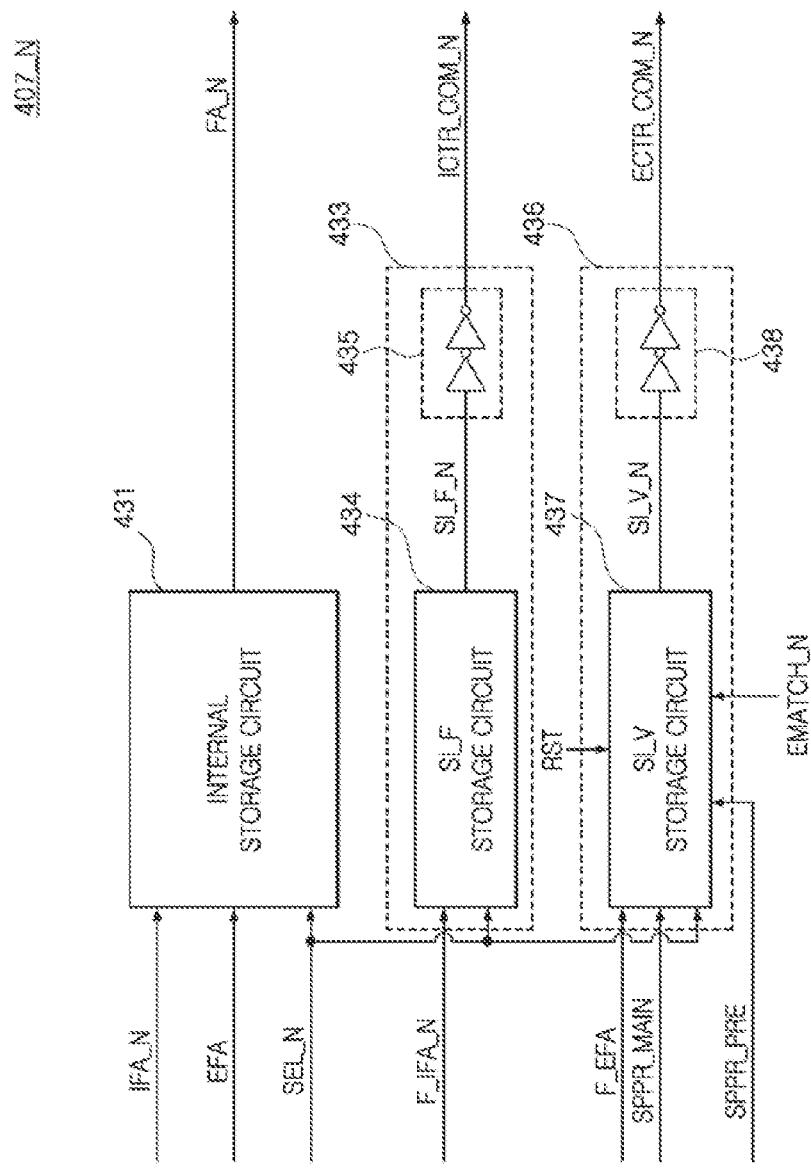
FIG. 15 is a diagram illustrating an embodiment of a failure information storage circuit illustrated in FIG. 14.

FIG. 15 is a diagram illustrating an embodiment of the N^th failure information storage circuit 407_N illustrated in FIG. 14. As illustrated in FIG. 15, the N^th failure information storage circuit 407_N may include an internal storage circuit (INTERNAL STORAGE CIRCUIT) 431, an internal comparison control signal generation circuit 433 and an external comparison control signal generation circuit 436.

The internal storage circuit 431 may store and output one of the N^th internal failure information IFA_N and the external failure information EFA as the N^th failure information FA_N based on the N^th storage area signal SEL_N. When the N^th storage area signal SEL_N is activated in the internal information storage operation, the internal storage circuit 431 may store and output the N^th internal failure information IFA_N as the N^th failure information FA_N. When the N^th storage area signal SEL_N is activated in the internal information storage operation, the internal storage circuit 431 may store the first to (K-1)^th bits IFA_N<K-1:1> of the N^th internal failure information as the first to (K-1)th bits FA_N<K-1:1> of the N^th failure information. The K^th bit FA_N<K> of the N^th failure information may be set to a logic low level or a logic high level when performing the internal information storage operation. When the N^th storage area signal SEL_N is activated in the external information storage operation, the internal storage circuit 431 may store and output the external failure information EFA as the N^th failure information FA_N. When the N^th storage area signal SEL_N is activated in the external information storage operation, the internal storage circuit 431 may store the first to K^th bits EFA<K:1> of the external failure information as the first to K^th bits FA_N<K:1> of the N^th failure information.

The internal comparison control signal generation circuit 433 may include a fixed information storage circuit (SI_F STORAGE CIRCUIT) 434 and a buffer circuit 435. When the N^th storage area signal SEL_N is activated in the internal information storage operation, the internal comparison control signal generation circuit 433 may activate the N^th internal comparison control signal ICTR_COM_N based on the N^th internal information storage flag F_IFA_N which is activated.

The fixed information storage circuit 434 may receive the N^th internal information storage flag F_IFA_N based on the N^th storage area signal SEL_N, and may store and output it as an N^th fixed information signal SI_F_N. When the N^th storage area signal SEL_N is activated in the internal information storage operation, the fixed information storage circuit 434 may receive the N^th internal information storage flag F_IFA_N which is activated, and may store and output it as the N^th fixed information signal SI_F_N which is activated.

The buffer circuit 435 may output the N^th internal comparison control signal ICTR_COM_N by buffering the N^th fixed information signal SI_F_N.

The external comparison control signal generation circuit 436 may include a variable information storage circuit (SI_V STORAGE CIRCUIT) 437 and a buffer circuit 438.

The external comparison control signal generation circuit 436 may generate the N^th external comparison control signal ECTR_COM_N based on the N^th storage area signal SEL_N, the external information storage flag F_EFA, the comparison control mode signal SPPR_PRE, the information storage mode signal SPPR_MAIN, the reset signal RST and the N^th external match signal EMATCH_N. When the N^th storage area signal SEL_N is activated during a period in which the information storage mode signal SPPR_MAIN is activated in the external information reception mode, the external comparison control signal generation circuit 436 may activate the N^th external comparison control signal ECTR_COM_N based on the external information storage flag F_EFA which is activated. When the N^th external match signal EMATCH_N is activated during a period in which the comparison control mode signal SPPR_PRE is activated in the external information reception mode, the external comparison control signal generation circuit 436 may control whether to activate the N^th external comparison control signal ECTR_COM_N. When the N^th external match signal EMATCH_N is activated during a period in which the comparison control mode signal SPPR_PRE is activated in the external information reception mode, the external comparison control signal generation circuit 436 may inactivate the N ^th external comparison control signal ECTR_COM_N.

The variable information storage circuit 437 may generate an N^th variable information signal SI_V_N based on the N^th storage area signal SEL_N, the external information storage flag F_EFA, the comparison control mode signal SPPR_PRE, the information storage mode signal SPPR_MAIN, the reset signal RST and the N^th external match signal EMATCH_N. The variable information storage circuit 437 may receive the external information storage flag F_EFA based on the information storage mode signal SPPR_MAIN and the N^th storage area signal SEL_N, and may store and output the N^th variable information signal SI_V_N. When the N^th storage area signal SEL_N is activated during a period in which the information storage mode signal SPPR_MAIN is activated in the external information reception mode, the variable information storage circuit 437 may receive the external information storage flag F_EFA which is activated, and may store and output the N^th variable information signal SI_V_N which is activated. The variable information storage circuit 437 may control whether to activate the N^th variable information signal SI_V_N, based on the comparison control mode signal SPPR_PRE and the N^th external match signal EMATCH_N. When the N^th external match signal EMATCH_N is activated during a period in which the comparison control mode signal SPPR_PRE is activated in the external information reception mode, the variable information storage circuit 437 may inactivate the N^th variable information signal SI_V_N. The variable information storage circuit 437 may initialize the N^th variable information signal SI_V_N based on the reset signal RST. When performing the initialization operation, the variable information storage circuit 437 may inactivate the N^th variable information signal SI_V_N.

The buffer circuit 438 may output the N^th external comparison control signal ECTR_COM_N by buffering the N^th variable information signal SI_V_N.

Figure 16:
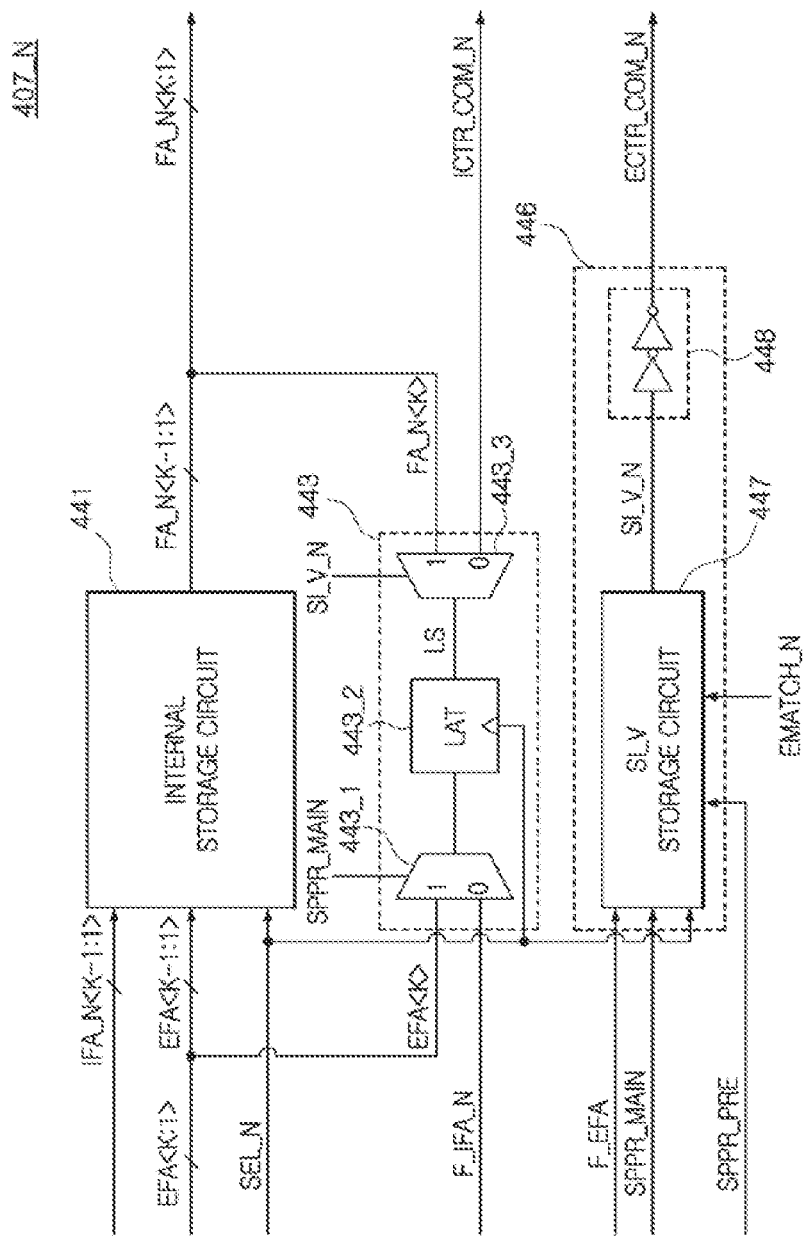
FIG. 16 is a diagram illustrating another embodiment of the failure information storage circuit illustrated in FIG. 14.

FIG. 16 is a diagram illustrating another embodiment of the N^th failure information storage circuit 407_N illustrated in FIG. 14. As illustrated in FIG. 16, the N^th failure information storage circuit 407_N may include an internal storage circuit (INTERNAL STORAGE CIRCUIT) 441, a storage-combined circuit 443 and an external comparison control signal generation circuit 446.

The internal storage circuit 441 may store and output ones of the first to (K−1)^th bits IFA_N<K−1:1> of the N^th internal failure information and the first to (K−1)^th bits EFA<K−1:1> of the external failure information as the first to (K−1)^th bits FA_N<K−1:1> of the N^th failure information, based on the N^th storage area signal SEL_N. When the N^th storage area signal SEL_N is activated in the internal information storage operation, the internal storage circuit 441 may store and output the first to (K−1)^th bits IFA_N<K−1:1> of the N^th internal failure information as the first to (K−1)^th bits FA_N<K−1:1> of the N^th failure information. When the N^th storage area signal SEL_N is activated in the external information storage operation, the internal storage circuit 441 may store and output the first to (K−1)^th bits EFA<K−1:1> of the external failure information as the first to (K−1)^th bits FA_N K−1:1> of the N^th failure information.

The storage-combined circuit 443 may store one of the K^th bit EFA<K> of the external failure information and the N^th internal information storage flag F_IFA_N, as a latch signal LS, based on the information storage mode signal SPPR_MAIN and the N^th storage area signal SEL_N. The storage-combined circuit 443 may output the latch signal LS, stored based on the variable information signal SI_V, as one of the K^th bit FA_N<K> of the N^th failure information and the N^th internal comparison control signal ICTR_COM_N. When the N^th storage area signal SEL_N is activated and the information storage mode signal SPPR_MAIN is inactivated in the internal information storage operation, the storage-combined circuit 443 may store the N^th internal information storage flag F_IFA_N which is activated, as the latch signal LS. When the N^th variable information signal SI_V_N is inactivated in the internal information storage operation, the storage-combined circuit 443 may output the latch signal LS which is activated, as the N^th internal comparison control signal ICTR_COM_N. When the N^th storage area signal SEL_N and the information storage mode signal SPPR_MAIN are activated in the external information storage operation, the storage-combined circuit 443 may store the K^th bit EFA<K> of the external failure information as the latch signal LS. When the N^th variable information signal SI_V_N is activated in the external information storage operation, the storage-combined circuit 443 may output the latch signal LS as the K^th bit FA_N<K> of the N^th failure information. The storage-combined circuit 443 may include a multiplexer 443_1, a latch circuit 443_2 and a demultiplexer 443_3.

The external comparison control signal generation circuit 446 may include a variable information storage circuit (SI_V STORAGE CIRCUIT) 447 and a buffer circuit 448. Since the external comparison control signal generation circuit 446 is implemented in the same manner as the external comparison control signal generation circuit 436 illustrated in FIG. 15, detailed description thereof will be omitted herein.

Figure 17:
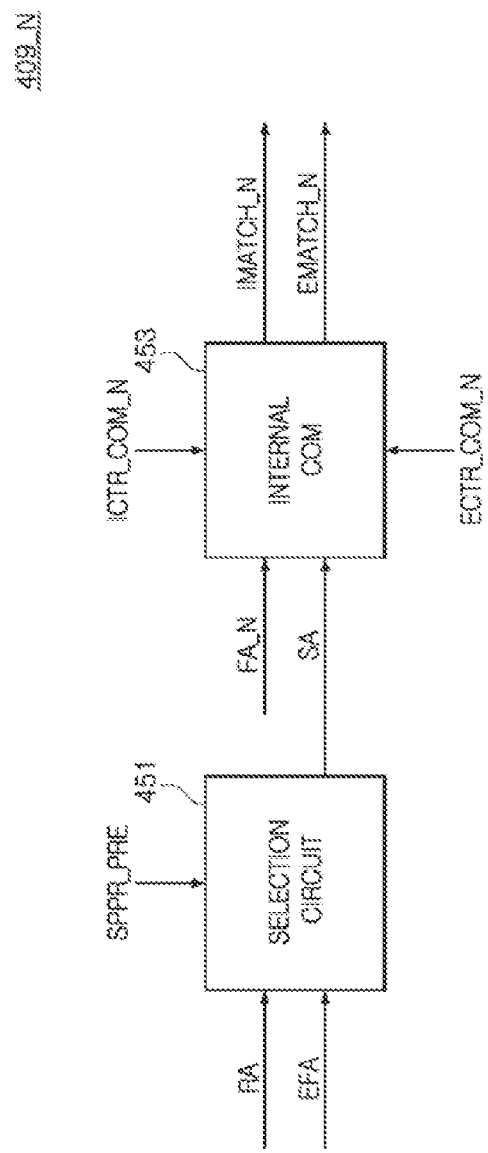
FIG. 17 is a block diagram illustrating the configuration of an embodiment of a failure information comparison circuit illustrated in FIG. 14.

FIG. 17 is a block diagram illustrating an embodiment of the N^th failure information comparison circuit 409_N illustrated in FIG. 14. As illustrated in FIG. 17, the N^th failure information comparison circuit 409_N may include an information selection circuit (SELECTION CIRCUIT) 451 and an internal failure information comparison circuit (INTERNAL COM) 453.

The information selection circuit 451 may output selected comparison information SA by selecting one of the row address RA and the external failure information EFA based on the comparison control mode signal SPPR_PRE. The selected comparison information SA may have first to K^th hits. Since the information selection circuit 451 is implemented in the same manner as the information selection circuit 251 illustrated in FIG. 6, detailed description thereof will be omitted herein.

The internal failure information comparison circuit 453 may generate the N^th internal match signal IMATCH_N and the N^th external match signal EMATCH_N by comparing the selected comparison information SA with the N^th failure information FA_N, based on the N^th internal comparison control signal ICTR_COM_N and the N^th external comparison control signal ECTR_COM_N.

When the N^th internal comparison control signal ICTR_COM_N is activated, the internal failure information comparison circuit 453 may compare first to (K-1)^th bits SA<K-1:1> of the selected comparison information with the first to (K-1)^th bits FA_N<K-1:1> of the N^th failure information. When the N^th internal comparison control signal ICTR_COM_N is activated and the first to (K-1)^th bits SA<K-1:1> of the selected comparison information and the first to (K-1)^th hits FA_N<K-1:1> of the N^th failure information are the same, the internal failure information comparison circuit 453 may activate the N^th internal match signal IMATCH_N. When the N^th internal comparison control signal ICTR_COM_N is activated and the first to (K-1)^th bits SA<K-1:1> of the selected comparison information and the first to (K-1)^th bits FA_N<K-1:1> of the N^th failure information are different, the internal failure information comparison circuit 453 may inactivate the N^th internal match signal IMATCH_N. When the N^th internal comparison control signal ICTR_COM_N is inactivated, the internal failure information comparison circuit 453 may inactivate the N^th internal match signal IMATCH_N.

When the N ^th external comparison control signal ECTR_COM_N is activated, the internal failure information comparison circuit 453 may compare the first to K^th bits SA<K:1> of the selected comparison information with the first to K^th bits FA_N<K:1> of the N^th failure information. When the N^th external comparison control signal ECTR_COM_N is activated and the first to K^th bits SA<K:1> of the selected comparison information and the first to K^th bits FA_N<K:1> of the N^th failure information are the same, the internal failure information comparison circuit 453 may activate the N^th external match signal EMATCH_N. When the N^th external comparison control signal ECTR_COM_N is activated and the first to K^th bits SA<K:1> of the selected comparison information and the first to K^th bits FA_N<K:1> of the N^th failure information are different, the internal failure information comparison circuit 453 may inactivate the N^th external match signal EMATCH_N. When the N^th external comparison control signal ECTR_COM_N is inactivated, the internal failure information comparison circuit 453 may inactivate the N^th external match signal EMATCH_N.

FIG. 18 is a diagram to assist in the explanation of an operation in which the second apparatus 320 illustrated in FIG. 14 stores external failure information EFA having information included in information of the previously stored internal failure information IFA in the external information reception mode. Referring to FIG. 18, the second apparatus 320 may sequentially perform an internal information storage operation OP41, an external information reception mode OP42 and an active operation.

The internal failure information storage circuit 401 may output the first internal failure information IFA_1 and the second internal failure information IFA_2 when performing the internal information storage operation OP41. The first internal failure information IFA_1 may have a combination corresponding to a first combination RA1 and a second combination RA2 of the row address RA. The second internal failure information IFA_2 may have a combination corresponding to a third combination RA3 and a fourth combination RA4 of the row address RA.

The storage area signal generation circuit 405 may activate the first and second storage area signals SEL_1 and SEL_2 when performing the internal information storage operation OP41.

The first failure information storage circuit (FIRST FA STORAGE CIRCUIT) 407_1 may store the first internal failure information IFA_1 (see FIG. 15) as the first failure information FA_1 (see FIG. 15), based on the first storage area signal SEL_1 (see FIG. 15) which is activated when performing the internal information storage operation OP41. The first failure information storage circuit 407_1 may store a first fixed information signal SI_F_1 (see FIG. 15) which is activated to a logic high level based on the first storage area signal SEL_1 (see FIG. 15) which is activated when performing the internal information storage operation OP41, and may activate the first internal comparison control signal ICTR_COM_1 (see FIG. 15).

The second failure information storage circuit (SECOND FA STORAGE CIRCUIT) 407_2 may store the second internal failure information IFA_2 (see FIG. 15) as the second failure information FA_2 (see FIG. 15), based on the second storage area signal SEL_2 (see FIG. 15) which is activated when performing the internal information storage operation OP41. The second failure information storage circuit 407_2 may store a second fixed information signal SI_F_2 (see FIG. 15) which is activated to a logic high level 'H,' based on the second storage area signal SEL_2 (see FIG. 15) which is activated when performing the internal information storage operation OP41, and may activate the second internal comparison control signal ICTR_COM_2 (see FIG. 15).

The operation control circuit 403 may output the external failure information EFA having a third combination RA3 of the row address RA when performing the external information reception mode OP42.

The storage area signal generation circuit 405 may activate the third storage area signal SEL_3 when performing the external information storage operation of the external information reception mode OP42.

When performing the external information storage operation in the external information reception mode OP42, the third failure information storage circuit (THIRD FA STORAGE CIRCUIT) 407_3 may store the external failure information EFA (see FIG. 15) as the third failure information FA_3 (see FIG. 15), based on the third storage area signal SEL_3 (see FIG. 15) which is activated. When performing the external information storage operation in the external information reception mode OP42, the third failure information storage circuit 407_3 may store a third variable information signal SI_V_3 (see FIG. 15) which is activated to a logic high level 'H,' based on the third storage area signal SEL_3 (see FIG. 15) which is activated, and may activate the third external comparison control signal ECTR_COM_3 (see FIG. 15).

When performing the active operation, the information comparison circuit 407 may receive the row address RA having the first combination RA1.

When the combination of the row address RA corresponds to the first failure information FA_1 based on the first internal comparison control signal ICTR_COM_1 activated when performing the active operation, the information comparison circuit 407 may activate the first internal match signal IMATCH_1.

When the combination of the row address RA and the third failure information FA _3 are the same based on the third external comparison control signal ECTR_COM_3 activated when performing the active operation, the information comparison circuit 407 may activate the third external match signal EMATCH_3.

When the third external match signal EMATCH_3 is activated, the repair control circuit 410 may inactivate the first match signal MATCH_1.

When the third external match signal EMATCH_3 is activated, the repair control circuit 410 may activate the third match signal MATCH_3.

As is apparent from the above description, when storing, for the repair operation, the internal failure information IFA and the external failure information EFA in a storage space, the second apparatus 320 may adjust a storage capacity in which the external failure information EFA is stored, depending on the set storage capacity in which the internal failure information IFA is stored, thereby using a storage space, in which the internal failure information IFA is not stored, as a storage space for storing the external failure information EFA. In addition, the second apparatus 320 may compare the external failure information EFA, applied from the outside, with the previously stored external failure information EFA, and accordingly, may control, in advance, the repair operation so that the repair operation is not performed on the external failure information EFA the same as the external failure information EFA applied from the outside, thereby preventing an abnormal operation that occurs when the external failure information EFA are the same in the repair operation, Also, the second apparatus 320 may compare a combination of the row address RA with the previously stored internal failure information IFA and external failure information EFA in the active operation, and accordingly, may control, in advance, the repair operation so that the repair operation is not performed on the internal failure information IFA including information set in the external failure information EFA, thereby preventing an abnormal operation that occurs when, in the repair operation, the internal failure information IFA includes information set in the external failure information EFA.

While various embodiments have been described above, it will be understood to those skilled in the art that the embodiments described are by way of example only. Accordingly, the apparatus performing a repair operation described herein should not be limited based on the described embodiments.

What is claimed is:

1. An apparatus comprising:
a storage area signal generation circuit configured to generate a storage area signal when performing an internal information storage operation and an external information storage operation; and
an information storage circuit configured to receive internal failure information, stored in the apparatus, based on the storage area signal and store the received internal failure information as failure information in a set storage capacity, and store external failure information, applied from outside the apparatus, as the failure information in a variable storage capacity, the variable storage capacity being adjusted depending on the set storage capacity.

2. The apparatus according to claim wherein the information storage circuit comprises a plurality of failure information storage circuits which receive one of the internal failure information and the external failure information and store the received information as the failure information, a sum of the set storage capacity and the variable storage capacity being set as a storage capacity of the plurality of failure information storage circuits.

3. The apparatus according to claim 1, wherein, when performing the internal information storage operation, the information storage circuit receives the internal failure information and stores the received internal failure information as the failure information in the set storage capacity, the set storage capacity being set as a capacity corresponding to the number of internal failure information programmed in the apparatus.

4. The apparatus according to claim 1, further comprising:
an internal failure information storage circuit configured to output the internal failure information programmed when performing the internal information storage operation, the internal failure information being set as a combination of a row address corresponding to a memory cell which has failed.

5. The apparatus according to claim 1, wherein
the storage area signal generation circuit activates the storage area signal corresponding to the set storage capacity when performing the internal information storage operation, and
the information storage circuit stores the internal failure information in a failure information storage circuit corresponding to the storage area signal which is activated when performing the internal information storage operation.

6. The apparatus according to claim 1, wherein, each time the information storage circuit performs the external information storage operation, the information storage circuit receives the external failure information and stores the received external failure information as the failure information in the variable storage capacity.

7. The apparatus according to claim 1, further comprising:
an operation control circuit configured to generate the external failure information from an external address applied from an external apparatus in an external information reception mode, the external failure information being set as a combination of the row address corresponding to a memory cell which has failed.

8. The apparatus according to claim 1, wherein
the storage area signal generation circuit activates one of storage area signals corresponding to a remaining storage capacity each time the external information storage operation is performed, and
the information storage circuit stores the external failure information in a failure information storage circuit corresponding to the storage area signal activated each time the external information storage operation is performed, the remaining storage capacity being set as a difference between the storage capacity of the plurality of failure information storage circuits and a capacity in which the failure information is stored in the plurality of failure information storage circuits.

9. The apparatus according to claim 1, further comprising:
an information comparison circuit configured to generate a match signal for performing a repair operation, by comparing a combination of the row address with the failure information when performing an active operation.

10. An apparatus comprising:
a first failure information storage circuit configured to receive first internal failure information stored in the apparatus and store the received first internal failure information as first failure information, when performing an internal information storage operation, and activate a first comparison control signal; and a first failure information comparison circuit configured to generate a first match signal by comparing external failure information, applied from outside the apparatus, with the first failure information based on the first comparison control signal in an external information reception mode, the first match signal being activated to control whether to activate the first comparison control signal.

11. The apparatus according to claim 10, wherein the first failure information storage circuit activates the first comparison control signal when an internal information storage flag is activated, the internal information storage flag being activated when the first internal failure information is programmed in the apparatus in the internal information storage operation.

12. The apparatus according to claim 10, wherein the first failure information comparison circuit activates the first match signal when the first comparison control signal is activated in the external information reception mode and the external failure information and the first failure information are the same.

13. The apparatus according to claim 10, wherein the first failure information storage circuit inactivates the first comparison control signal when the first match signal is activated in the external information reception mode.

14. The apparatus according to claim 10, wherein the first failure information comparison circuit activates the first match signal for a repair operation, when the first comparison control signal is activated in an active operation and a combination of a row address and the first failure information are the same.

15. The apparatus according to claim 10, further comprising:
a second failure information storage circuit configured to receive the external failure information when performing an external information storage operation in the external information reception mode and store the received external failure information as second failure information, and activate a second comparison control signal.

16. The apparatus according to claim 15, further comprising:
a second failure information comparison circuit configured to generate a second match signal by comparing the external failure information with the second failure information based on the second comparison control signal when performing a comparison control operation in the external information reception mode, the external information storage operation being performed after the comparison control operation is performed.

17. An apparatus comprising:
a first failure information storage circuit configured to receive external failure information applied from outside the apparatus and store the received external failure information as first failure information, in a first external information reception mode, and activate a first comparison control signal; and
a first failure information comparison circuit configured to generate a first match signal by comparing the external failure information, applied in a second external information reception mode, with the first failure information based on the first comparison control signal, the first match signal being activated to control whether to activate the first comparison control signal.

18. The apparatus according to claim 17, wherein the first failure information comparison circuit receives the external failure information applied in the second external information reception mode and compares the received external failure information with the first failure information, the second external information reception mode being performed after the first external information reception mode is ended.

19. The apparatus according to claim 17, wherein the first failure information storage circuit activates the first comparison control signal when an external information storage flag is activated in the first external information reception mode, the external information storage flag being activated when receiving an external address in the first external information reception mode.

20. The apparatus according to claim 17, wherein the first failure information comparison circuit activates the first match signal when the first comparison control signal is activated in the second external information reception mode and the external failure information applied in the second external information reception mode and the first failure information are the same.

21. The apparatus according to claim 17, wherein the first failure information storage circuit inactivates the first comparison control signal when the first match signal is activated in the second external information reception mode.

22. The apparatus according to claim 17, wherein the first failure information comparison circuit activates the first match signal for a repair operation, when the first comparison control signal is activated in an active operation and a combination of a row address and the first failure information are the same.

23. The apparatus according to claim 17, further comprising:
a second failure information storage circuit configured to receive the external failure information applied when performing an external information storage operation in the second external information reception mode and store the received external failure information as second failure information, and activate a second comparison control signal.

24. The apparatus according to claim 23, further comprising:
a second failure information comparison circuit configured to generate a second match signal by comparing the external failure information, applied when performing a comparison control operation in the second external information reception mode based on the second comparison control signal, with the second failure information, the external information storage operation being performed after the comparison control operation is performed.

25. An apparatus comprising:
a failure information storage circuit configured to receive one of internal failure information stored in the apparatus and external failure information applied from outside the apparatus and store the received information as failure information, and generate a comparison control signal by receiving an internal information storage flag and an external information storage flag; and
a failure information comparison circuit configured to generate a match signal for a repair operation, by comparing a combination of a row address with the failure information based on the comparison control signal when performing an active operation.

26. The apparatus according to claim 25, wherein the failure information storage circuit receives the internal failure information and stores the received internal failure information as the failure information, when performing an internal information storage operation, and receives the external failure information and stores the received external failure information as the failure information, when performing in an external information reception mode.

27. The apparatus according to claim 25, wherein the failure information storage circuit activates the comparison control signal when one of the internal information storage flag and the external information storage flag is activated, the internal information storage flag being activated when the internal failure information is programmed in the apparatus in the internal information storage operation and the external information storage flag being activated when receiving an external address in the external information reception mode.

28. The apparatus according to claim 25, wherein the failure information comparison circuit activates the match signal when the comparison control signal is activated in the active operation and a combination of the row address and the failure information are the same.

29. The apparatus according to claim 25, wherein the failure information comparison circuit generates the match signal by comparing the external failure information, applied when performing a comparison control operation in the external information reception mode based on the comparison control signal, with the failure information.

30. The apparatus according to claim 29, wherein the failure information storage circuit stores one of the internal failure information and the external failure information as the failure information when performing an external information storage operation in the external information reception mode, the external information storage operation being performed after the comparison control operation is performed.

31. The apparatus according to claim 25, wherein the failure information storage circuit inactivates the comparison control signal when the match signal is activated in the external information reception mode.

32. An apparatus comprising:
an information storage circuit configured to receive internal failure information stored in the apparatus and store the received internal failure information as first failure information, and receive external failure information applied from outside the apparatus and store the received external failure information as second failure information;
an information comparison circuit configured to, when performing an active operation, generate an internal match signal by comparing a combination of a row address with the first failure information, and generate an external match signal by comparing a combination of the row address with the second failure information; and
a repair control circuit configured to generate a first match signal for a repair operation, based on the internal match signal, and generate a second match signal for the repair operation, based on the external match signal, the external match signal being activated to control whether to activate the first match signal.

33. The apparatus according to claim 32, wherein the information comparison circuit comprises:
a first failure information comparison circuit configured to activate the internal match signal when an internal comparison control signal is activated in the active operation and a combination of the row address corresponds to information set in the first failure information.

34. The apparatus according to claim 33, wherein the information storage circuit comprises:
a first failure information storage circuit configured to receive the internal failure information and store the received internal failure information as the first failure information, when performing an internal information storage operation, and activate the internal comparison control signal, the internal failure information having the number of bits that is different from the number of bits of the row address.

35. The apparatus according to claim 32, wherein the information comparison circuit comprises:
a second failure information comparison circuit configured to activate the external match signal when an external comparison control signal is activated in the active operation and a combination of the row address and the second failure information are the same.

36. The apparatus according to claim 35, wherein the information storage circuit comprises:
a second failure information storage circuit configured to receive the external failure information and store the received external failure information as the second failure information, in an external information reception mode, and activate the external comparison control signal, the external failure information having the number of bits that is the same as the number of bits of the row address.

37. The apparatus according to claim 36, wherein the second failure information storage circuit inactivates the external comparison control signal when the external match signal is activated in the external information reception mode.

38. The apparatus according to claim 32, wherein the repair control circuit comprises:
a first internal repair control circuit configured to activate the first match signal when the internal match signal is activated and the external match signal is inactivated, and inactivate the first match signal when the external match signal is activated; and
a second internal repair control circuit configured to activate the second match signal when the external match signal is activated.

* * * * *

UNITED STATES PATENT AND TRADEMARK OFFICE
CERTIFICATE OF CORRECTION

PATENT NO. : 11,693,564 B2
APPLICATION NO. : 17/330038
DATED : July 4, 2023
INVENTOR(S) : Byeong Chan Choi Page 1 of 1

It is certified that error appears in the above-identified patent and that said Letters Patent is hereby corrected as shown below:

In the Claims

Claim 2, in Column 47, Line 62:
Please replace: "2. The apparatus according to claim wherein the information storage circuit comprises a plurality of failure information storage circuits which receive one of the internal failure information and the external failure information and store the received information as the failure information, a sum of the set storage capacity and the variable storage capacity being set as a storage capacity of the plurality of failure information storage circuits."
With --2. The apparatus according to claim 1, wherein the information storage circuit comprises a plurality of failure information storage circuits which receive one of the internal failure information and the external failure information and store the received information as the failure information, a sum of the set storage capacity and the variable storage capacity being set as a storage capacity of the plurality of failure information storage circuits.--

Signed and Sealed this
Seventeenth Day of December, 2024

Derrick Brent
*Acting Director of the United States Patent and Trademark Office*